United States Patent [19]

Stephens

[11] Patent Number: 4,608,531
[45] Date of Patent: Aug. 26, 1986

[54] TEST SET FOR TESTING AS A UNIT AN AMPLIFIER SYSTEM HAVING SEVERAL MODULES

[76] Inventor: Michael L. Stephens, 834 CRS, MACMAA, Hurlburt Field, Fla. 32544

[21] Appl. No.: 491,105

[22] Filed: May 3, 1983

[51] Int. Cl.[4] .............................................. G01R 15/12
[52] U.S. Cl. .................................................. 324/73 R
[58] Field of Search ........... 324/73 R, 73 AT, 73 PC, 324/158 R, 383, 402, 158 F; 340/514, 515, 516; 455/226; 364/550, 551, 579, 580; 371/23, 27, 29

[56] References Cited

U.S. PATENT DOCUMENTS

| | | | |
|---|---|---|---|
| 3,681,681 | 8/1972 | Auslander | 324/158 R |
| 3,824,462 | 7/1974 | Vinsani | 324/158 F |
| 4,146,085 | 3/1979 | Wills | 324/73 R |
| 4,189,778 | 2/1980 | Vogel | 364/579 |

Primary Examiner—Ernest F. Karlsen
Assistant Examiner—Walter E. Snow
Attorney, Agent, or Firm—Donald J. Singer; Bernard E. Franz

[57] ABSTRACT

An Automatic Flight Control System for helicopter control includes an amplifier unit having several modules, some of which are in duplicate. The tester comprises plugs with test jacks for connection to an amplifier unit and to a normal flight director indicator, so that the amplifier unit may be tested as a unit the way it is used in the aircraft. The tester includes an AC signal source for jumpering to test jacks to simulate input signals, resistors to simulate the servomechanism load, a heading simulator, and switches to simulate system connections of direct-current power for the different functions. The tester has the capability to test all circuits in the chassis and simulate all input signals used on the aircraft, while monitoring and comparing the dual channel outputs. It provides a method of detecting marriage problems between the altitude module, the altitude integrator module, and the rest of the amplifier unit.

2 Claims, 26 Drawing Figures

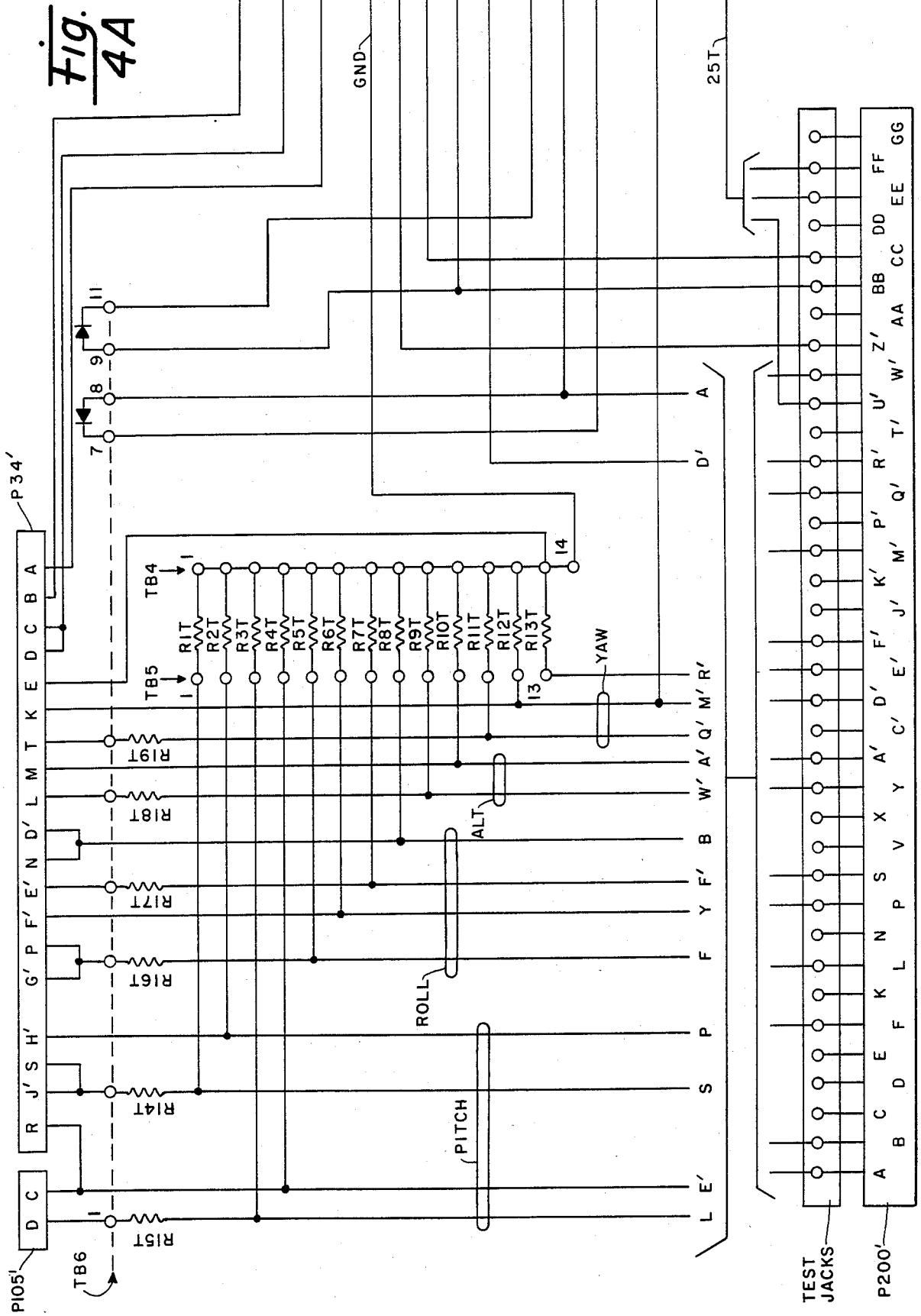

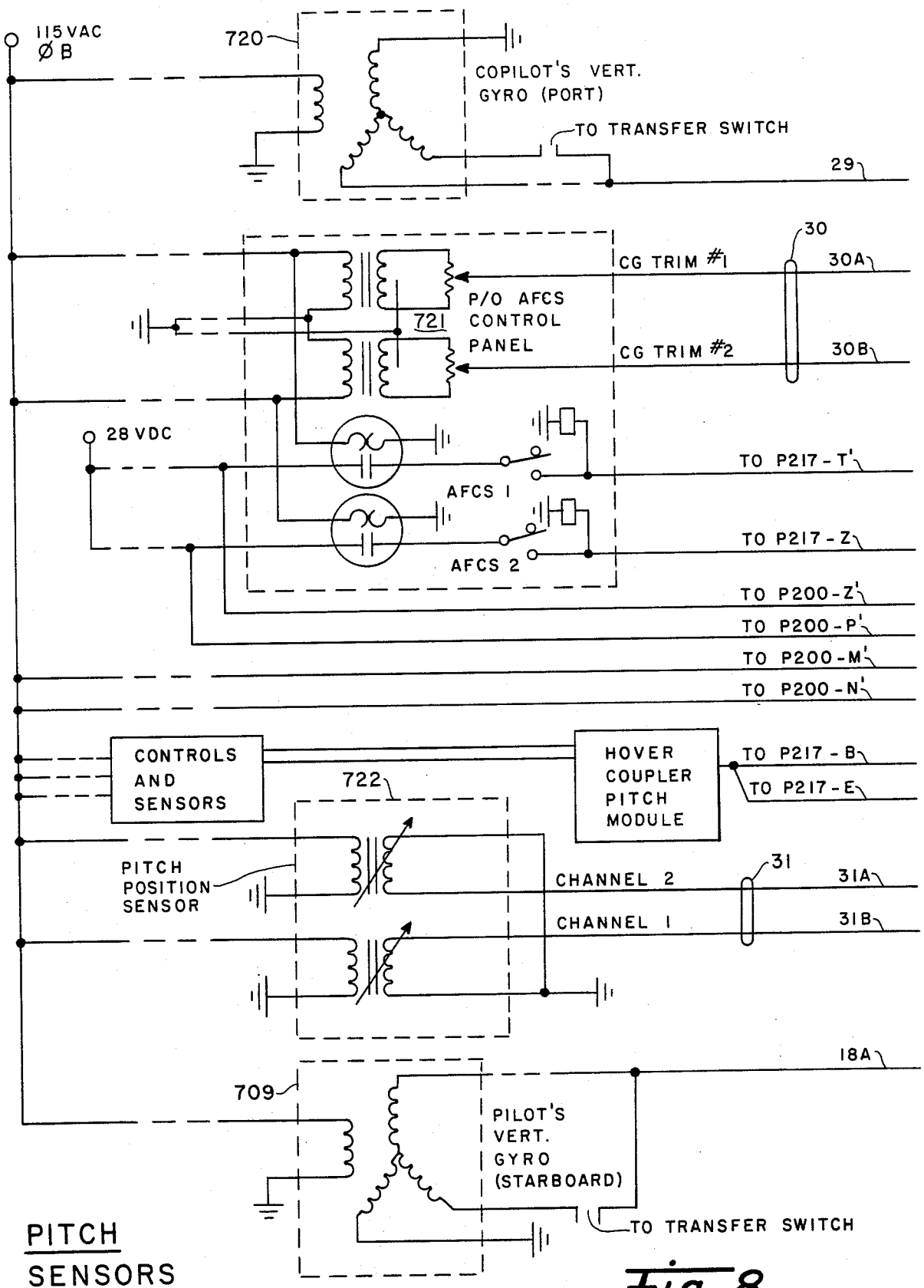
Fig. 8 — PITCH SENSORS

TEST SET FOR TESTING AS A UNIT AN AMPLIFIER SYSTEM HAVING SEVERAL MODULES

RIGHTS OF THE GOVERNMENT

The invention described herein may be manufactured and used by or for the Government of the United States for all governmental purposes without the payment of any royalty.

BACKGROUND OF THE INVENTION

This invention relates generally to a means for testing an amplifier system having a plurality of amplifier modules, and more particularly to an arrangement with a test set for testing an automatic flight control system amplifier.

The avionics of modern aircraft and spacecraft may include an automatic flight control system having various input controls and sensors, an electrical system for integrating and amplifying signals from the controls and sensors, and output servo devices for controlling the craft.

The H-53 helicopter for example has an automatic flight control system (AFCS) which includes an AFCS amplifier having several amplifier modules. These include two identical pitch modules for redundancy, two identical roll modules for redundancy, an altitude module, a yaw module, and a yaw synchronizer module. An additional feature of the system provides hover control, which includes an altitude integrator module in the AFCS amplifier. Each module is one printed circuit card assembly. The seven or eight modules are inserted parallel to each other in jacks of the main chassis, on a multilayer flexible printed wiring board. There are also some components mounted directly on the chassis.

The established procedures for testing this amplifier in the past (used for many years) consisted of removing the seven or eight circuit-card modules and testing them individually on a component tester. There was no provision for electrically testing the amplifier chassis or comparing the response of different channels to a given input. One difficulty by way of example was that adjustment of certain parameters of individual modules might be within prescribed limits, but when used in the system be out of balance.

SUMMARY OF THE INVENTION

An object of the invention is to provide a tester which permits more adequate and complete testing of the amplifier as a unit. Another object is to reduce the time required for testing and repair.

The tester, according to the invention, tests the AFCS amplifier as a complete unit, the way it is installed in the aircraft. It has the capability to test all the circuits in the chassis and to simulate all input signals used on the aircraft, while monitoring and comparing the dual channel outputs. It provides a method of detecting marriage problems between the altitude module, the altitude integrator module, and the rest of the amplifier.

Utilizing this tester has greatly reduced the repair time for AFCS amplifiers while significantly improving the reliability. The previous estimated repair time for a complete check of the amplifier and chassis was 16 hours. Utilizing this invention, the amplifier can be more thoroughly and more accurately tested in two hours.

The invention solves several problems. It provides a method of electrically checking chassis circuitry for malfunctions. It permits comparing dual channel outputs to enable detection of imbalances between circuit cards. It tests compatability of altitude and altitude integrator circuit cards. It tests fuse failure detector lights. It saves enormous amounts of time testing the entire amplifier. None of these capabilities were available prior to this invention, and lack of these capabilities created significant difficulties in the maintenance of the AFCS amplifiers.

BRIEF DESCRIPTION OF THE DRAWING

FIGS. 4A and 5B (together referred to as FIG. 4) constitute a schematic and block diagram of the tester;

FIGS. 8-12 are schematic and functional block diagrams of portions of the AFCS amplifier, along with some of the associated units of the AFCS system;

DETAILED DESCRIPTION

Figure 1:
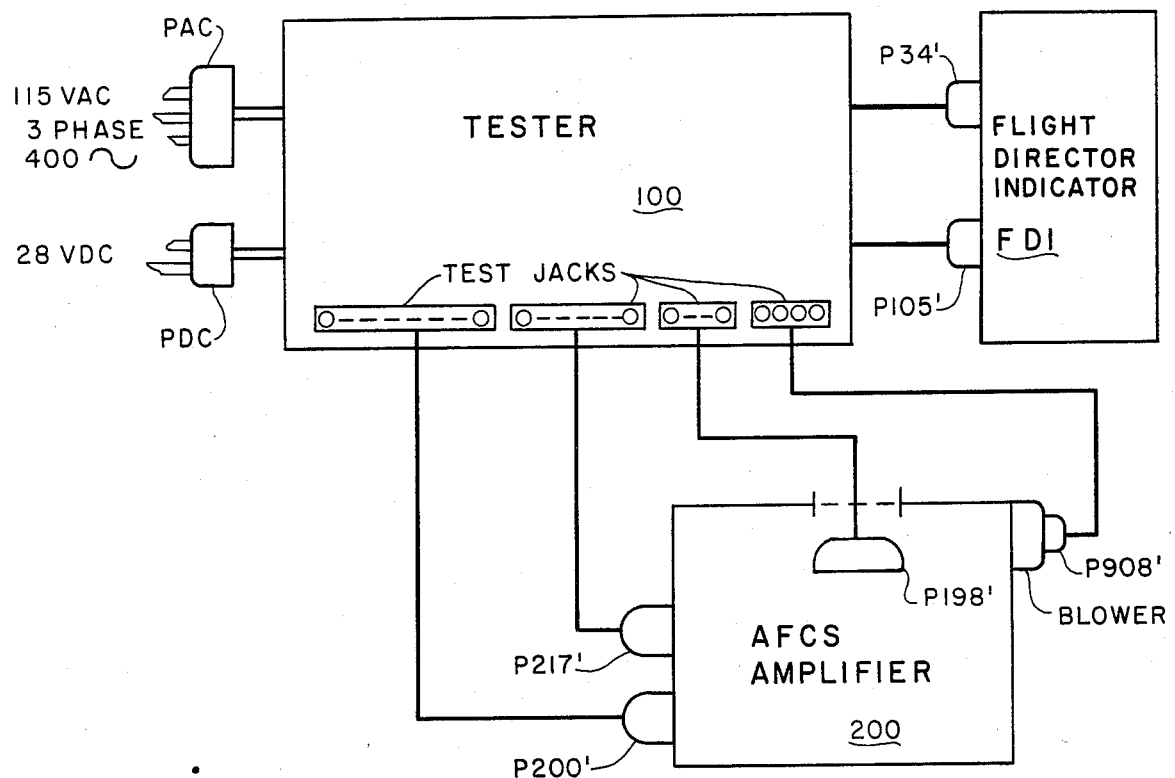
FIG. 1 is a block diagram of the test set up according to the invention.

A block diagram of a test setup according to the invention is shown in FIG. 1. The tester 100 is connected to an AFCS amplifier 200 to be tested, and to a normal flight director indicator FDI. There are eight cables with plugs which are a part of the tester 100. Power is supplied via plug PAC for connection to a 115 volt AC, three phase, 400 cycle outlet; and via plug PDC for connection to a 28-volt DC outlet. The other six plugs correspond to plugs normally used in the system on the aircraft, and therefore are given the same designation, except that the prime symbol is used for the tester plugs. In the system, the plugs mate with jacks having the same number, with a "P" prefix for plugs and a "J" prefix for jacks. The plugs P200' and P217' mate with jacks of the AFCS amplifier 200 which provide the basic input and output electrical paths for both signals and power. The plug P198' mates inside the amplifier cabinet with a connector on one of the modules. The plug P908' connects to supply the three-phase AC power to a blower which is part of the cooling system of the amplifier. The plugs P34′ and P105′ mate with jacks of the flight director indicator FDI.

The tester 100 includes test jacks which terminate the cables to the four plugs P200′, P217′, P198′ and P908′. There is an individual test jack connected via the cable to each pin of these plugs, and identified by the pin designations. Some of the test jacks for plugs P200′ and P217′ are also connected via circuits in the tester to the plugs P34′ and P105′.

The basic operation of the tester 100 involves use of jumpers connected to certain of the test jacks to supply simulated input signals to the AFCS amplifier 200. Output signals from amplifier pass through the tester to the flight director indicator FD. The output indications are observed to determine the health of the amplifier, and in some cases to make adjustments.

AMPLIFIER STRUCTURE

Figure 2:
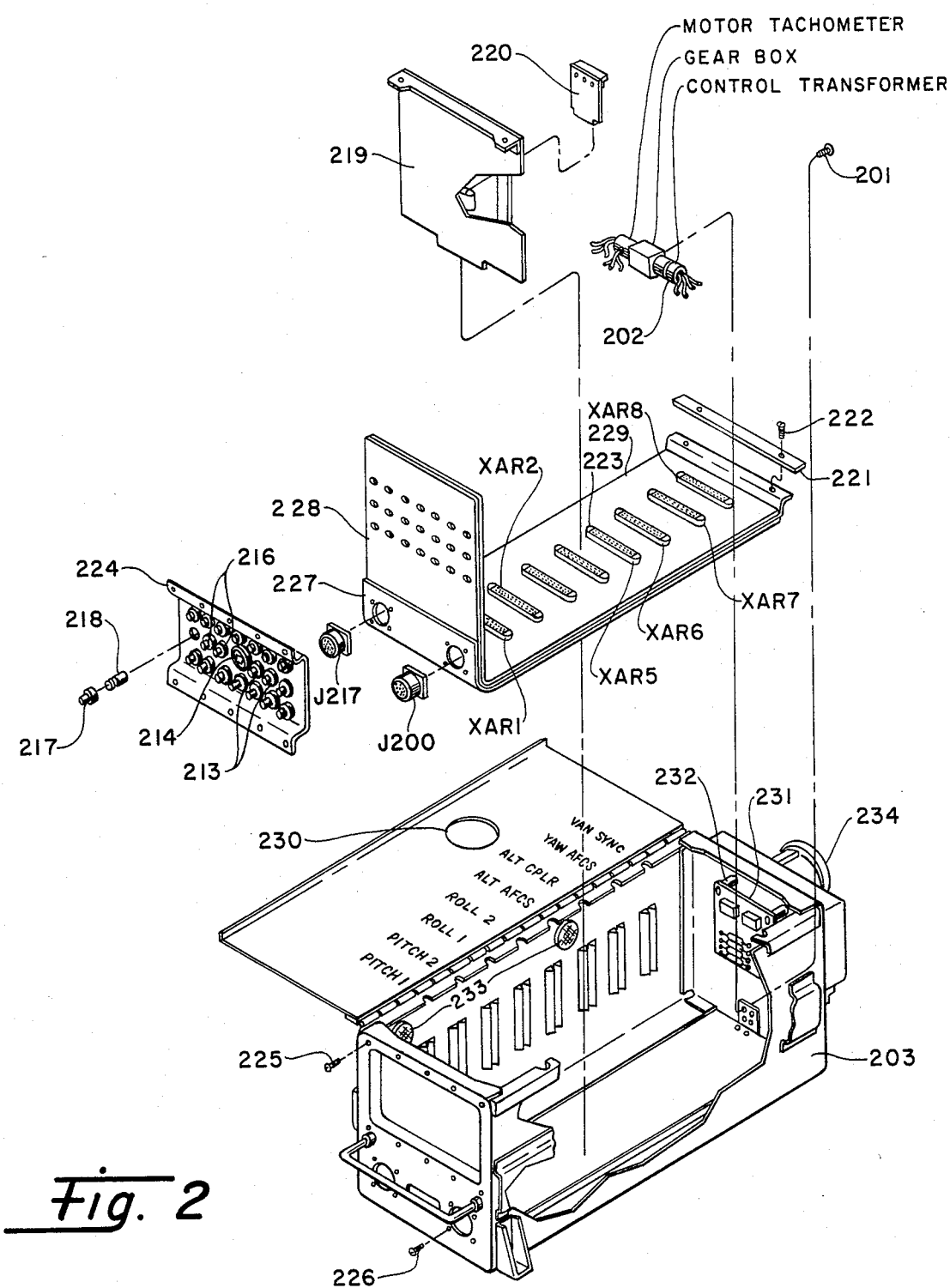
FIG. 2 is an exploded pictorial view of the AFCS amplifier.

The mechanical structure of an AFCS amplifier 100 is shown in the exploded view of FIG. 2. The parts are as follows:

| | |
|---|---|
| 201 | Screw (4 required) |
| 202 | Servo motor-generator and control transformer |
| 203 | AFCS amplifier chassis |
| XAR1 | Receptacle XAR1 |
| XAR2 | Receptacle XAR2 |
| XAR3 | Receptacle XAR3 |
| XAR4 | Receptacle XAR4 |
| XAR5 | Receptacle XAR5 |
| XAR6 | Receptacle XAR6 |
| XAR7 | Receptacle XAR7 |
| XAR8 | Receptacle XAR8 |
| J200 | Receptacle J200 |
| J217 | Receptacle J217 |
| 213 | Spare fuses |
| 214 | Elapsed time indicator |
| 216 | Spare fuses |
| 217 | Fuse cap |
| 218 | Fuse |
| 219 | Roll 2 AFCS amplifier module AR4 (typical) |
| 220 | Roll 2 AFCS amplifier gain capsule (typical) |
| 221 | Stiffener |
| 222 | Screws (2 required) |
| 223 | Screws (16 required) |
| 224 | Fuse panel |
| 225 | Screws (7 required) |
| 226 | Screws (8 required) |
| 227 | Flexible printed wiring board (layer No. 1) |
| 228 | Flexible Printed wiring board (layer No. 2) |
| 229 | Flexible printed wiring board (layer No. 3) |
| 230 | J198 altitude integrator module access hole |
| 231 | Component deck assembly |
| 232 | Stand-off |
| 233 | Ventilating plug |
| 234 | Cooling unit assembly |

FLIGHT DIRECTOR INDICATOR

Figure 3:
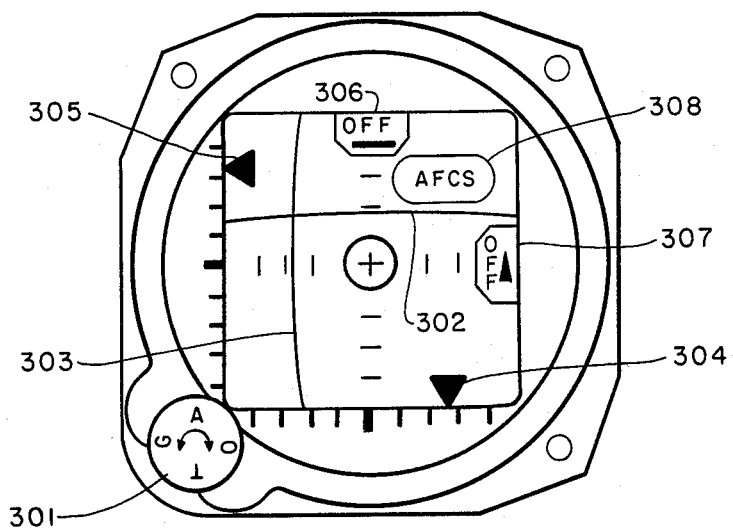
FIG. 3 is a view of the face of the flight director indicator.

The face of a flight director indicator is shown in FIG. 3. Two such indicators are used with the Automatic Flight Control System, one for the pilot and one for the copilot. Each flight director indicator is a multi-purpose indicator having a mode selector switch with a selector knob 301 adjacent to the lower left corner of the face. The dial face contains a horizontal indicator bar 302, a vertical indicator bar 303, a horizontal arrow 304, a vertical arrow 305, two OFF flags 306 and 307, and a mode indicator flag 308.

The circuit (not shown) within each flight director indicator comprises a separate servo device for each indicator. Each servo device comprises a coil which when energized moves a magnetic element mechanically connected to the indicator. The circuit also includes some resistors and diodes. The mode selector switch has four positions and a large number of poles. The switch interconnects the terminals of jacks J34 and J105, and the coils, resistors, and diodes in various configurations. In each position selected terminals are coupled to the coils, while others may be disconnected or shunted directly or through resistors.

The positions on the mode selector knob are designated "A", "G", "T", and "O". The "A" position connects indicator pointers and bars to respective AFCS serve valves. The "O" position connects indicator bars and pointers to the AFCS 1 and AFCS 2 pitch and roll amplifier outputs. The "T" position connects localizer signals to the vertical bar.

The function of the respective indicators are as follows:

| | |
|---|---|
| Mode Indicator 308 | Indicates mode selected by mode selector switch. |
| Pitch (horizontal) bar 302 | Moves up or down to indicate polarity and amplitude of pitch channel output signals. |
| Roll (vertical) bar 303 | Moves left or right to indicate polarity and amplitude of roll channel output or localizer signals. |
| Yaw (horizontal) arrow 304 | Moves left or right to indicate polarity and amplitude of yaw channel output signals. |
| Collective (vertical) arrow 305 | Moves up or down to indicate polarity and amplitude of collective channel output signals. |
| OFF flag 306 | Appears when no power is applied to AFCS indicator. |

When the mode selector switch 301 is in the A position, the horizontal and vertical indicator bars 304 and 305 indicate the amount and direction of AFCS correction fed to the pitch and roll servo valves. The horizontal arrow 304 indicates the AFCS signal input to the yaw servo valve. The vertical arrow 303 indicates the AFCS signal input to the collective servo valve. The term AFCS appears in a mode flag window 308 whenever the mode selector switch is positioned to the A mode.

The term ON—ON appears in the mode flag window 308 whenever mode selector switch 301 is positioned to O mode. In the O mode, the horizontal bar 304 indicates amount and direction of pitch AFCS 2 amplifier output to the pitch servo valve. The vertical bar 303 indicates amount and direction roll AFCS 1 amplifier output to the servo valve and the horizontal pointer 304 indicates amount and direction of roll AFCS 2 amplifier output to the roll servo valve.

The flight director indicator is used in flight to monitor AFCS correction signals and during checkout to determine whether the various AFCS channels are functioning properly.

TESTER CIRCUIT

Figure 4B:
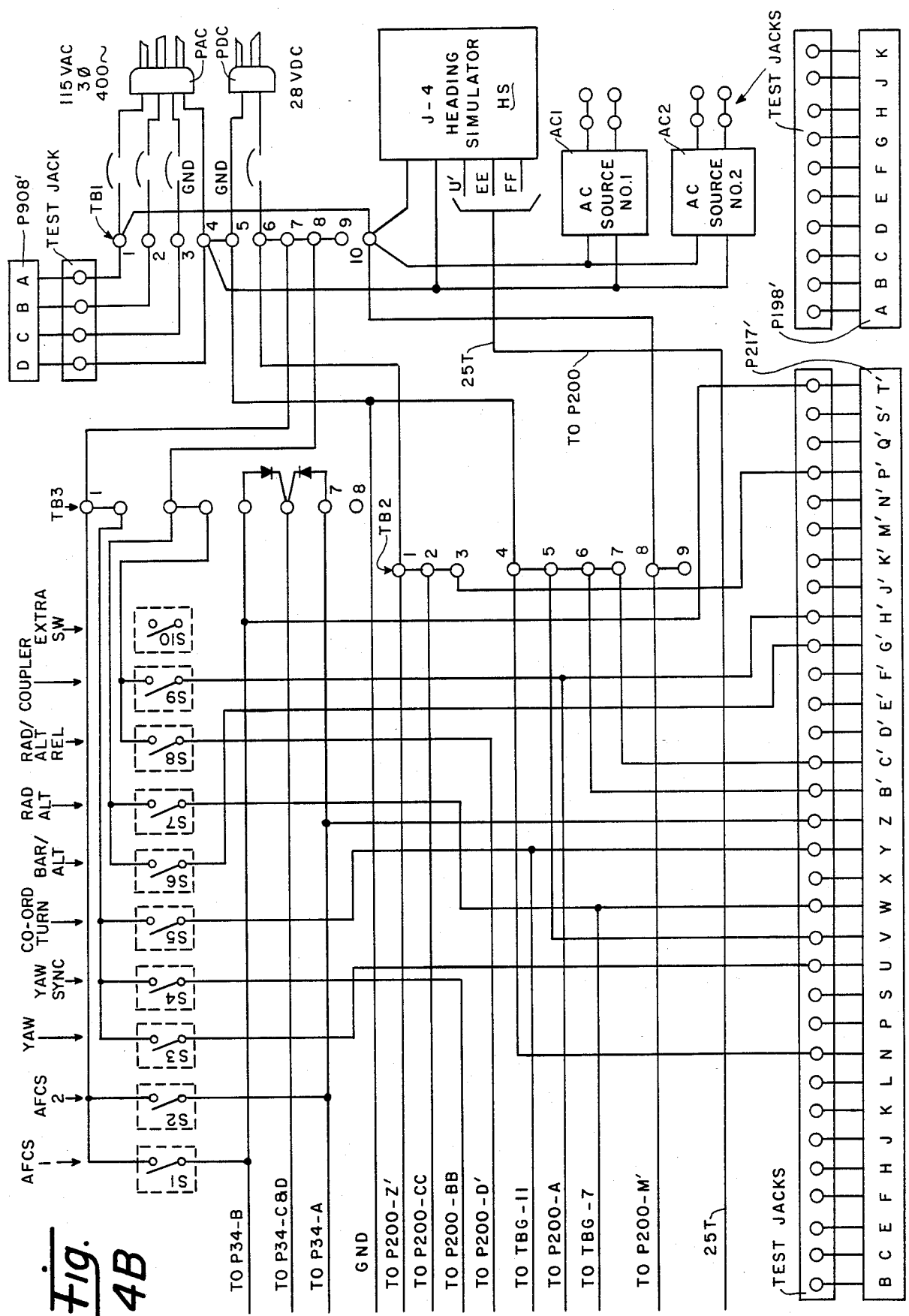

The circuit of the tester 100 is shown in FIG. 4 (comprising FIG. 4A placed to the left of FIG. 4B).

The plugs PAC and PDC are shown as in FIG. 1. They are connected via 5-ampere circuit breakers to a terminal board TB1. The other plugs are represented by long narrow rectangles containing the pin designations. In the system technical publications some of the letter designations are underlined to distinguish from others having the same letter—herein the underline is replaced by a prime mark as more convenient. In the actual tester the pin designations are shown with the test jacks.

The switches S1 to S9 simulate switches of the AFCS system for applying 28-volt DC power to the amplifier 200 and the indicator FDI. Switch S10 is a spare. Twelve 1000-ohm resistors R1T–R12T simulate servo windings which in the AFCS system are coupled to the amplifier outputs for the pitch, roll, altitude and yaw channels. An 11,300-ohm resistor R13T simulates the input of a trim stick amplifier of the system. Six 78,700-ohm resistors R14T–R19T simulate series resistors of the system between the amplifier outputs and the indicator FDI. The resistors R1T–R13T are connected between terminals of terminal boards TB4 and TB5, while resistors R14T–R19T are connected between terminals of terminal boards TB5 and TB6. Diodes connected to terminals of terminal boards TB3 and TB6 control the flow of DC power.

Figure 5:
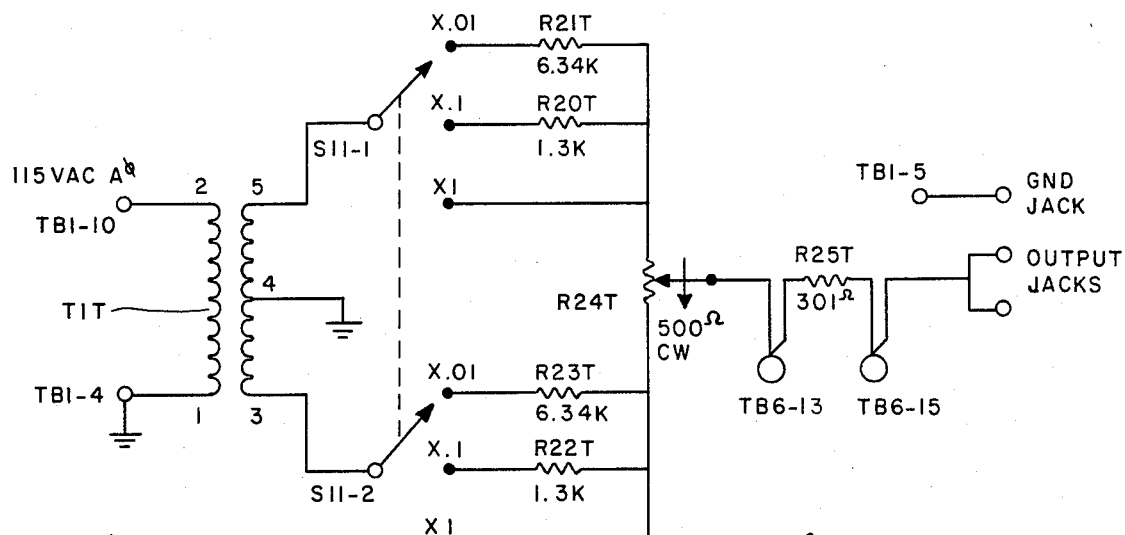
FIG. 5 is a schematic diagram of one of the AC sources shown in FIG. 4B.
Figure 6:
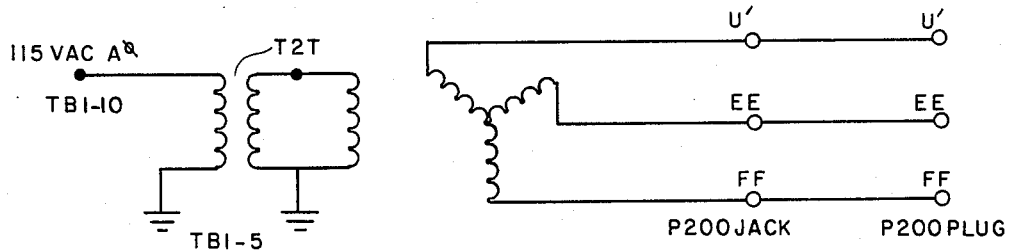
FIG. 6 is a schematic diagram of the heading simulator shown in FIG. 4B.

The tester includes a heading simulator HS shown in detail in FIG. 6, and two AC sources AC1 and AC2. The two AC sources are identical, and the circuit of source AC2 is shown in detail in FIG. 5.

In FIG. 5, the transformer T1T has a primary winding between its pins 1 and 2 connected to terminals TB1-4 and TB1-10. The secondary winding between pins 3 and 5 has a center tap at pin 4 to ground. A rotary switch S11 has three positions at two poles S11-1 and S11-2 which select the output voltage range as times 0.01, times 0.1 or times 1. The series resistors R20T and R22T for the times 0.1 range have a value of 1,300 ohms; and the series resistors R21T and R23T for the times 0.01 range have values of 6,340 ohms. The potentiometer resistor R24T has a value of 0–1000 ohms. A 310-ohm output resistor R25T from the slider of the potentiometer R24T to output jacks is connected between board terminals TB6-13 and TB6-15.

AUTOMATIC FLIGHT CONTROL SYSTEM

Figure 7A:
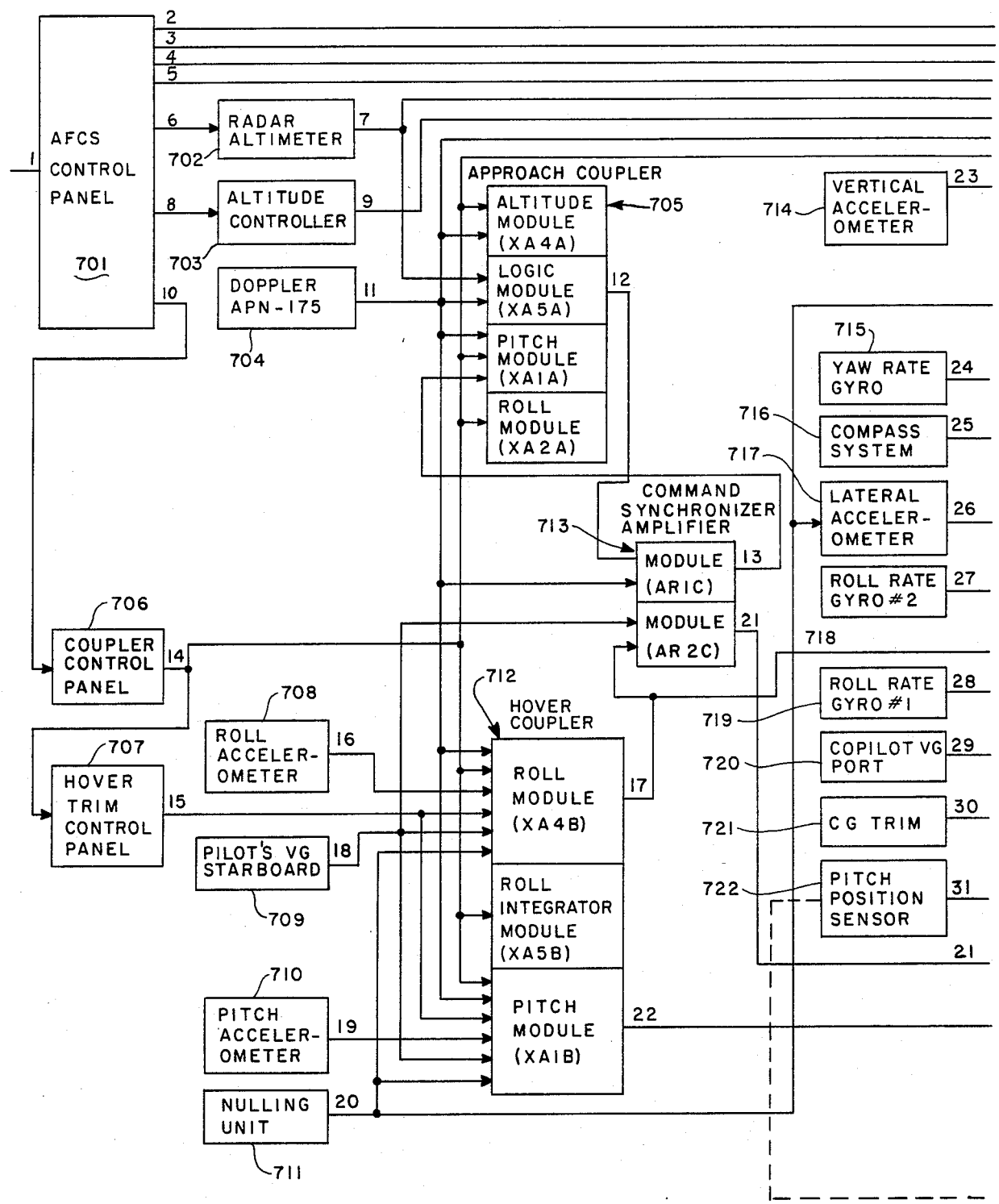
FIGS. 7A, 7B and 7C (together referred to as FIG. 7) when placed together constitute a block diagram of the AFCS (automatic flight control) system.
Figure 7B:
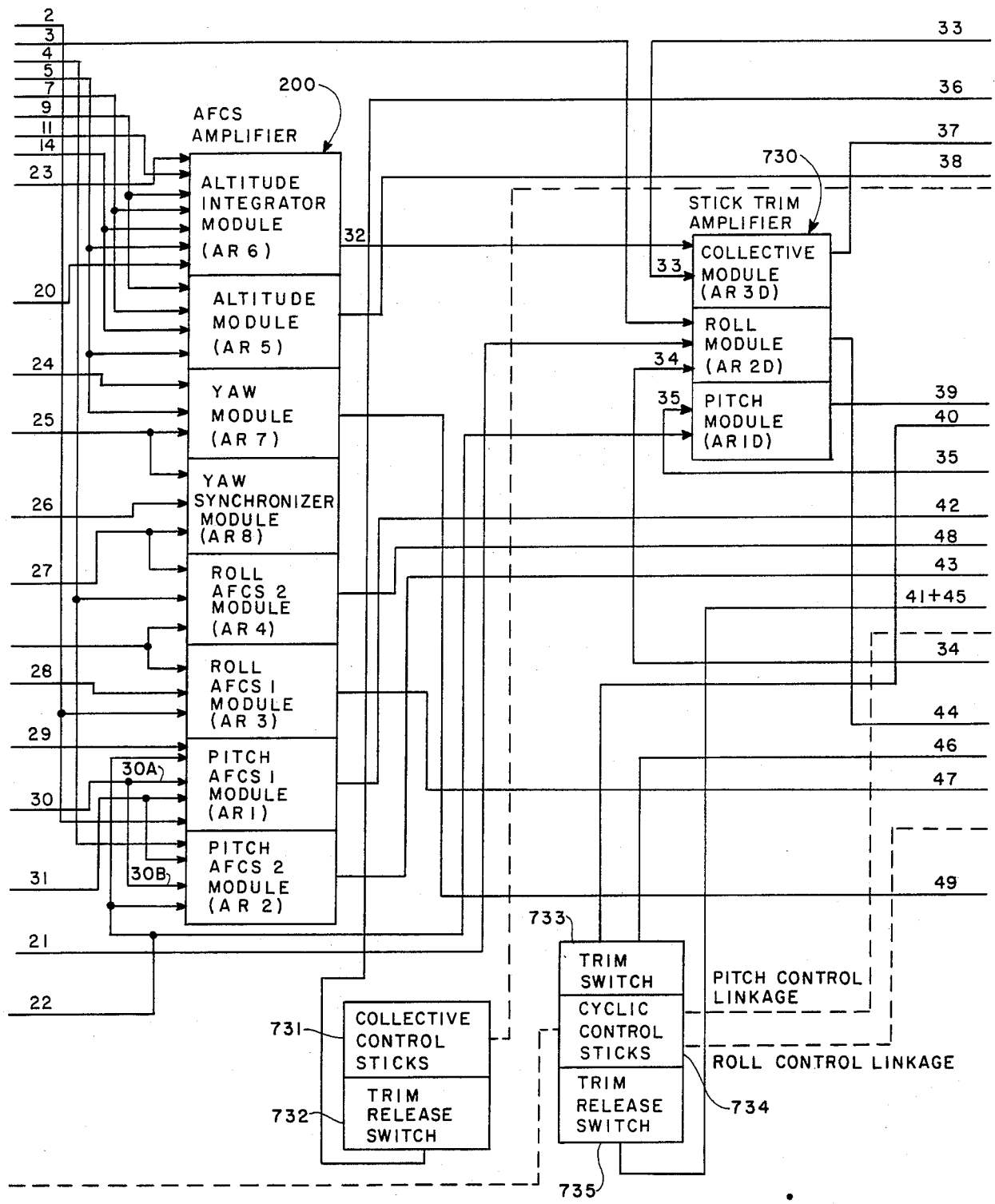
Figure 7C:
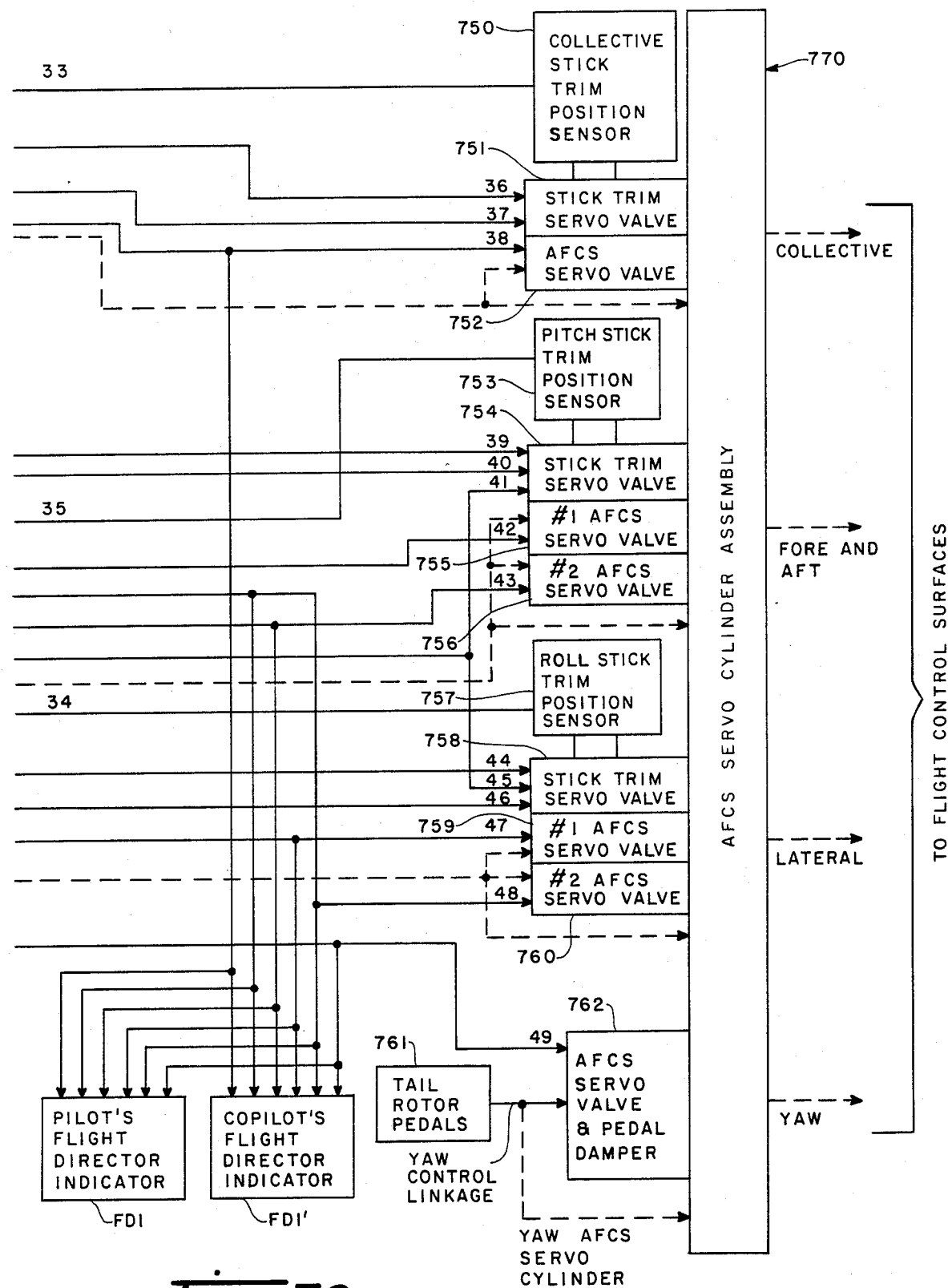

Before explaining the operation of the tester, it will be helpful to first describe the Automatic Flight Control System and the AFCS amplifier circuits. The system block diagram is shown in FIG. 7 (comprising FIGS. 7A, 7B and 7C placed together left to right). The connections of the AFCS amplifier 200 into the system are shown in more detail for some of the channels in FIGS. 8–12, where dashes in the connecting lines represent omitted connectors, terminal boards, circuit breakers, power busses, and the like. The system described is equipped with an option designated LNRS (LIMITED, NIGHT RECOVERY SYSTEM), which includes a hover coupler, and provides a special hover ability.

The interconnection lines 1–49 shown in FIG. 7 (some also shown in other figures) each comprise one or more conductors, for power and signal channels as follows:

1. 23 volts direct current
2. AFCS 1 engage voltage
3. Output from hover coupler to stick trim through AFCS control panel
4. AFCS 2 engage voltage
5. AFCS yaw/alt engage voltage
6. Alt set control voltage
7. Radar altimeter rate signal
8. Altitude controller clutch engage voltage
9. Altitude controller altitude error signal
10. 28 VDC for coupler control panel Functions
11. Pitch, roll, and altitude doppler signals
12. Logic decel and approach signals
13. CDR output signal
14. Coupler control panel engage functions
15. Hover trim control panel trim output voltages
16. Roll accelerometer signal
17. Hover Coupler Roll Signal
18. Starboard vertical gyro proportional displacement signal
19. Pitch accelerometer signal
20. Nulling unit signal
21. Command synchronizer amplifier roll signal
22. Hover coupler pitch signal
23. Vertical accelerometer signal
24. Yaw rate gyro signal
25. Compass proportional heading signal
26. Lateral accelerometer skid and slip signal
27. Roll rate gyro #2 signal
28. Roll rate gyro #1 signal
29. Port vertical gyro proportional displacement signal
30. CG trim control output signal
31. Cyclic stick pitch position sensor displacement signal
32. Altitude error signal
33. Stick trim collective position sensor signal
34. Stick trim roll position sensor signal
35. Stick trim pitch position sensor signal
36. 28 VDC to collective stick trim turn-on valve
37. Stick trim altitude correction signal
38. Altitude error signal
39. Stick trim pitch correction signal
40. Power trim pitch servo valve input
41. 28 VDC to pitch stick trim turn-on valve
42. AFCS 1 pitch error signal
43. AFCS 2 pitch error signal
44. Stick trim roll correction signal
45. 28 VDC to roll stick trim turn-on valve
46. Power trim roll servo valve input
47. AFCS 1 roll error signal
48. AFCS 2 roll error signal
49. Heading Error signal

FUNCTIONAL OPERATION OF THE SYSTEM

The AFCS performs its function by introducing correction signals into the flight control system. Correction signals represent any difference between a desired flight attitude initially established through setting of controls and the actual flight attitude. Correction signals are derived by the AFCS amplifier 200 from signals introduced by controls built into AFCS or by sensors within related systems. A desired attitude in pitch, roll, altitude, or yaw is established through flight controls and maintained by AFCS. All correction signals from the AFCS amplifier are applied to the AFCS servocylinders and then to the flight controls. Flight controls now receive a hydraulic boost to correct flight attitude. The sensed correction signal diminishes as the helicopter approaches desired flight attitude.

The AFCS hover system is expanded to include additional components. Additional correction signals are applied to the approach and hover coupler amplifiers. Within the amplifiers, corrections signals are amplified, shaped, switched, and then applied to the AFCS amplifier.

AFCS is functionally divided into four channels: Pitch, roll, altitude, and yaw. Pitch and roll channel desired attitudes are established by positioning the cyclic stick. Cyclic stick trim system maintains desired cyclic stick position in both axes to control established reference. Desired altitude is established by the altitude controller through engagement of BAR ALT for basic altitude or from the radar altimeter through the ALT SET control by engagement of RDR ALT. Desired heading (yaw) is established by the compass system through engagement of the yaw channel.

The stick trim system, operationally interrelated with AFCS, provides the operator with a system which stabilizes the physical position of cyclic and collective sticks to establish and hold an in-flight cruise regime. With stick trim system engaged and either AFCS 1 or AFCS 2 engaged, cyclic stick position is maintained by the trim system.

Terminology of on-on operation and on-off operation relates to pitch and roll channel mode selection only. With AFCS SERVO pressure selected (1 or 2), and with both AFCS 1 and AFCS 2 selected (both lights on), on-on selection is made. This means that a combination of AFCS 1 and AFCS 2 (pitch and roll) correction signals are applied to AFCS servo valves. With AFCS SERVO pressure selected (1 or 2), and with either AFCS 1 or AFCS 2 selected, on-off selection is made. This means that only the AFCS selected supplies correction signals to AFCS servo valves. Either mode of operation, on-on or on-off, may be monitored on either flight director indicator when in the A (AFCS) mode or O (ON-ON) mode.

Functional Operation of Pitch Channel

There are two redundant pitch channels, AFCS 1 and AFCS 2. Functionally, No. 1 pitch and No. 2 pitch channels are identical, and only one path is discussed. The pitch channel of AFCS stabilizes the helicopter in the pitch (forward-and-aft) axis. This is accomplished through use of the pitch vertical gyro signal, the cyclic stick pitch position sensor signal, and the CG (center of gravity) TRIM control signal.

Vertical gyro output signal 18 and 29 is proportional to the actual attitude (tilt angle) of the helicopter. Position sensor signal 31 represents the desired attitude of the helicopter referenced to the position of the cyclic stick. CG TRIM control signal 30 is used to ensure AFCS has its maximum authority regardless of any necessary cyclic stick movement.

Assume that the helicopter is flying at a desired attitude. Vertical gyro output is being cancelled by signals from the CG TRIM control and position sensor. Now assume that the helicopter position changes. Amplitude of the vertical gyro signal increases. Phase of the vertical gyro signal, in respect to $\phi B$, indicates direction of displacement. This signal is applied to the AFCS amplifier where it is transmitted to the AFCS pitch module.

If the helicopter is displaced from its original attitude, the vertical gyro signal is applied to the AFCS amplifier. The amplifier output signal is applied to the servo valve. As the servo valve moves, power piston displacement occurs causing the rotary wing blades to be repositioned. As the helicopter returns to the desired attitude, the vertical gyro signal decreases until the signal returns to its reference level and the helicopter returns to its desired attitude. While proportional signal decreases, pitch error signals oppose correction, thereby providing smooth helicopter response.

If, during the stabilizing process, the helicopter stabilizes at a point other than the desired attitude, it may be due to a change in center of gravity. Should center of gravity change, cyclic stick must be repositioned to regain initial attitude. Cyclic stick repositioning to counteract the effect of a center of gravity shift will produce a vertical gyro signal which is the same as before. However, the desired signal (composite signal) changes due to repositioning of the position sensor signal. Desired signal change results in servo displacement from center as center of gravity continues to shift. Each successive correction signal, by moving the cyclic stick position, will cause the servo valve to move until it reaches the end of its travel. At this point, AFCS capability to correct any helicopter motion in the direction of servo valve hardover would be lost. To correct this situation, CG TRIM is adjusted to cancel position sensor output change, centering the servo valve. There is an interaction between cyclic stick positioning and CG TRIM adjustment. The process of cyclic stick compensating movement and CG TRIM adjustment must be coordinated until the desired attitude is obtained and the servo valve is centered, which is visible on the flight director indicator.

The CG Trim control is split into two sections. Facing the AFCS control panel, the section on the left adjusts for AFCS 1, and the section on the right adjusts for AFCS 2. With AFCS in the on-on mode (O selected on the flight director indicator) CG TRIM lefthand section is used to center the pitch bar, and CG TRIM righthand section is used to center the pitch pointer.

With the cyclic stick at a desired reference position, the signal output of the pitch stick trim position sensor is null. If the stick position changes, a signal output proportional in amplitude to stick movement and phase oriented to direction results. The signal is fed to the stick trim amplifier. The amplified signal is applied to the servo valve which causes the cyclic stick to reposition back to the desired position through the stick trim piston.

There are two methods for changing desired cyclic stick position through stick trim. Holding the TRIM REL switch depressed and manually repositioning the cyclic stick will establish a new stick reference position. Pressing the four position STICK TRIM switch towards a position, FWD, AFT, L-Left or R-right, will cause the cyclic stick to reposition to a new desired reference position at a fixed rate.

On AFCS equipped with LNRS, additional sensor signals are used to stabilize the helicopter in the pitch axis. These signals are the pitch doppler signal, pitch trim signal, pitch hover trim signal, pitch accelerometer signal, and the vertical gyro signal.

The pitch doppler signal is in phase with $\phi B$ when moving forward with amplitude proportional to the groundspeed of the helicopter. The pitch trim control signal and pitch hover trim control signals are used for slight attitude changes during hovering operations. The pitch accelerometer signal is proportional to acceleration of the helicopter in the pitch axis and phase oriented to direction of displacement. The vertical gyro signal is proportional to the actual attitude of the helicopter.

Prior to coupler engagement, only basic AFCS signals are routed to the AFCS amplifier. Positioning the coupler mode switch to APPROACH and pressing the ENGAGE button provides a path for a decel command voltage through a fade-in circuit to the AFCS amplifier pitch 1 and pitch 2 modules and to the stick trim amplifier 730. The logic module fades in and fades out signals depending on the position of the helicopter in reference to the finder and shifter line.

Positioning the coupler mode switch to HOVER ensures the fade out of the decel command voltage. The sensor signals coupled into the AFCS amplifier now are the pitch trim signal, pitch doppler signal, pitch accel signal, and the vertical gyro signal.

Placing the mode select switch in the hover trim position engages the hover trim control panel. This allows limited repositioning of the helicopter in both the lateral and longitudinal axis.

During all modes of coupler operation, correction signals are constantly fed to the stick trim system. In the approach mode, the accelerometer signal and the vertical gyro signal are used during descent and the pitch doppler signal is used during hover for the correction signals. In the hover mode, the pitch doppler is summed with the pitch trim control signal of the coupler control panel, pitch accel signal, and vertical gyro signal and faded in with the doppler integral signal. The output is then used to drive the trim piston of the longitudinal AFCS servo through the stick trim amplifier and valve.

Functional Operation of Roll Channel

There are two redundant roll channels, AFCS 1 and AFCS 2. Functionally, No. 1 roll and No. 2 roll channels are identical, and only one path is discussed. The roll channel of AFCS stabilizes the helicopter in the roll (lateral) axis. This is accomplished through use of the foll vertical gyro signal and either of the roll rate vertical gyro signal and either of the roll rate gyros. The roll rate gyros produce true rate of change signals, whereas in the pitch channel, rate signals are derived from the vertical gyro signals.

Vertical gyro output amplitude is proportional to the amount of displacement (tilt angle) in the roll axis, and phase, in respect to $\emptyset B$, is dependent on displacement direction. Roll rate gyro output amplitude is dependent upon the rate at which the helicopter is displacing, and phase is dependent on displacement direction.

Vertical gyro output is coupled to the AFCS amplifier through the dual channel synchronizer. Synchronizing the vertical gyro signal takes place anytime the TRIM REL switch is depressed, or the STICK TRIM beeper switch on the cyclic stick grip is deflected left (L) or right (R), or the master switch control panel STICK TRIM - CYC switch is OFF.

If the helicopter displaces away from the desired attitude, vertical gyro output is proportional to the amount of tilt and phased according to displacement direction. This signal is coupled through the dual channel synchronizer to the AFCS amplifier. The amplifier applies signals to a roll servo valve. The servo valve positions the power piston in opposition to the error signal. Servo action causes the primary servo to move, repositioning the rotary wing blades and repositioning helicopter toward desired roll attitude. Movement toward desired attitude reduces vertical gyro signal output, thus reducing error signal. Should it be desired to change the roll attitude from that originally established, the cyclic stick would be repositioned by depressing the TRIM REL switch and manually moving the cyclic stick until desired attitude is obtained or automatically moving the stick by depressing the STICK TRIM power trim switch. Whenever either of these switches is used, the dual channel synchronizer is synchronized, and effectively the vertical gyro output signal is at null. As the desired attitude is reached and the switch released, vertical gyro signal through the synchronizer to the AFCS roll module is a null signal, thereby becoming a true reference signal.

Roll rate gyro output signal opposes any change from a steady-state attitude. As the helicopter displaces from a fixed attitude, rate gyro output increases proportionally to rate of displacement, with phase dependent upon displacement direction. In the AFCS amplifier the rate gyro signal is compared with the vertical gyro signal, and the resultant is applied to the servo valve causing the helicopter to stop its displacement. When the helicopter displacement stops, rate gyro signal amplitude decays to a null. As the helicopter starts to return to its original attitude, the rate gyro will produce a signal in the opposite phase which will oppose the change, thereby providing smooth helicopter response.

Operation of roll cyclic trim is the same as previously described for pitch with the following additions. The starboard vertical gyro provides a proportional attitude signal to the dual channel synchronizer. When dual channel synchronizer is not synchronized the vertical gyro outputs are fed to the stick trim amplifier roll module.

During a large coordinated turn, the pilot will manually roll the cyclic stick without using trim or release switches. The vertical gyro will immediately produce signals proportional to the helicopter attitude with respect to reference attitude. Stick trim position sensor signal will not build up immediately due to the transfer function of the stick trim piston. The vertical gyro signal is coupled, through the dual channel synchronizer, causing the stick trim servo valve to displace. Displacement of the stick trim servo valve creates a pressure differential which will be felt on the stick. As the turn is completed and the new heading established, the stick is released and the combined vertical gyro and stick sensor signal will cause the stick to be repositioned to its original attitude and the helicopter return to its reference attitude.

On AFCS equipped with LNRS, a roll coupler function provides for additional stabilization of the helicopter. Positioning the coupler mode switch to APPROACH routes sensor signals to the AFCS amplifier to provide roll attitude stabilization while in the approach mode. The sensor signals are also used in the hover and hover trim modes with the addition of the roll hover trim signal in the hover trim mode and the roll trim signal in both the hover and hover trim modes.

Functional Operation of Altitude Channel

The altitude channel of AFCS stabilizes the altitude of the helicopter. This is accomplished through engagement of the altitude controller or the radar altimeter. With power applied to AFCS, YAW ALT SERVO must be pressed for selection of altitude channel operation.

Pressing the BAR ALT engage button will engage the BAR ALT function (barometric altitude), as indicated by the BAR ALT light being illuminated. At the altitude that BAR ALT is engaged, the altitude controller clutch energizes, producing a null signal output. This null signal output represents desired altitude. Any change in signal output from null is a result of changing altitude and represents barometric altitude error. A signal output from the altitude controller is the difference between desired and actual altitude and is referred to as an error signal.

If the altitude changes from the engage altitude, the altitude controller signal output, representing a difference between desired and actual altitude, is supplied to the altitude AFCS module. Amplifier output is applied to the altitude AFCS servo valve. The servo valve positions the AFCS servo in opposition to the error signal. The servo causes the primary servo to move, repositioning the rotary wing blades collectively and resulting in the helicopter being repositioned in altitude towards the desired altitude.

Amplifier output is also fed to the collective stick trim amplifier and then to the stick trim servo valve. The stick trim servo valve drives its power piston which positions the collective stick through the force gradient spring. Movement of the collective occurs in opposition to the difference between desired and actual altitude. The error is now diminished towards desired altitude through the flight controls. The collective stick trim position sensor serves no function when an altitude channel of AFCS is engaged. The nulling unit is used to reduce minimum signals to the stick trim amplifier at desired altitude regimes.

Pressing the RDR ALT engage button will, if the BAR ALT is engaged, disengage BAR ALT. Conversely, if RDR ALT is engaged, pressing BAR ALT will disengage RDR ALT. The ALT SET control signal is applied to the radar altimeter receiver/transmitter (R/T) unit and compared in the R/T unit with the actual altitude signal from the radar altimeter. The difference between the two signals is the error signal which is applied to the AFCS altitude module. Simultaneously, the radar altimeter senses rate-of-change (Vz) and produces a signal proportional to this rate-of-change which is applied to the amplifier. The error signal and the Vz signal are summed and the resultant is processed the same as the BAR ALT signal.

On AFCS equipped with LNRS, a coupler function provides additional inputs to the AFCS amplifier. The altitude channel of the coupler system provides for a programmed rate of descent in the approach mode and for accurate altitude retention in the hover and hover trim modes.

Functional Operation of Yaw Channel

The yaw channel of AFCS is used in conjunction with the compass system to stabilize helicopter heading (heading retention) at any heading selected. In addition, the yaw channel provides a coordinated turn feature. The yaw channel is engaged when the YAW/ALT SERVO and AFCS YAW/ALT lights are on.

Assuming that the yaw channel is engaged at a desired helicopter heading, the yaw synchronizer represents this desired heading as a null output. If the helicopter does not change heading, there is a null output from the synchronizer, and no output from the rate gyro. As a result, there is no error signal (change from desired heading). If the helicopter heading changes due to outside forces, an output signal is produced by the synchronizer that is proportional to the difference between the desired and actual headings. The heading error signal is applied to the input of the AFCS amplifier. The yaw rate gyro also senses helicopter movement and produces a signal that opposes the change. This signal is applied to the amplifier. The resultant signal is applied to the servo valve. The servo valve positions the yaw AFCS servo in opposition to the error signal. The AFCS servo positions the primary servo which repositions the rotary rudder blades, causing the helicopter to return to the desired heading. As the helicopter starts to return to the desired heading, the yaw rate gyro produces a signal to oppose this movement. The result is that this signal serves as a dampening factor to decrease helicopter overshoot and provide smooth response.

When a change is made to a new desired heading by a force exerted on the rotary rudder pedals, synchronization takes place. The purpose of placing the yaw channel in synchronization during a deliberate heading change is to prevent correction back to a previous desired heading.

As the turn is executed and the output of the compass system changes, reflecting changing heading, the synchronizer nulls the compass output. When the helicopter reaches the new desired heading, pressure is released from the rotary rudder pedals, removing operating voltage from the yaw synchronizer circuitry. Heading retension now takes place. During synchronization, the yaw rate gyro output signal is still used. This signal opposes the direction of turn, providing a force feel during a manual turn.

The coordinated turn feature provides for changing helicopter heading through use of the cyclic stick at airspeeds greater than 60 knots. During a coordinated turn, the pilot places his feet on the pedals, activating the pedal switches, and rolls the cyclic stick to obtain a coordinated turn. When a coordinated turn is started, the heading signal from the compass system is synchronized. As the cyclic stick is displaced left or right, and the helicopter moves, roll rate gyro No. 2 produces a signal that is coupled to the input of the AFCS amplifier. This signal is applied to the yaw AFCS servo. The AFCS servo causes the rotary rudder blades to reposition, and the helicopter starts to change heading. As soon as the helicopter stops rolling, the output of the roll rate gyro decays to zero. The lateral accelerometer now senses any slip or skid of the helicopter. The signal output is applied to the AFCS amplifier filter network. The filter network filters any signals caused by normal helicopter vibration. The output of the amplifier filter is applied to the yaw AFCS servo. The accelerometer signal output and consequent error signal application to the servo valve lead the movement of the helicopter. This is due to the external forces acting on both the helicopter and on the pendulum within the accelerometer. Since the mass of the pendulum is much smaller than the mass of the helicopter, the pendulum will react quicker to any external forces, resulting in correction signals to the yaw AFCS servo which repositions the rotary rudder to counteract any forces and keeps the helicopter in a coordinated turn. Any slippage of the helicopter or tendency to fall into the turn is sensed by the accelerometer which increases the turn rate through use of AFCS. Any skid or sliding out of the turn is counteracted by decreasing the turn rate. The yaw rate gyro output signal is proportional to the turn rate. This signal is demodulated and differentiated, resulting in outputs to AFCS only during a change in turn rate. The differentiated signal is compared with any roll rate gyro signal. The output is summed with the lateral accelerometer signal, and the resultant is applied to the yaw AFCS servo. The yaw rate gyro signal applied to the yaw AFCS servo opposes any change in turn rate, thereby providing for a smooth helicopter response. When desired heading is reached, the cyclic stick is first released and then the pedals are released, so that new heading may be automatically maintained. Stick will automatically be repositioned, and the helicopter will return to original attitude. When the pedals are released, the automatic turn feature is disabled.

On AFCS equipped with LNRS, an additional sensor signal is applied to the yaw channel to further stabilize the helicopter in the yaw axis during approach and hover modes. This collective to yaw crossfeed is required to keep the helicopter on the desired heading at the end of the approach when the altitude hold mode is engaged by the logic module.

AFCS Amplifier Description

The amplifier (see FIG. 2) contains two receptacles, J200 and J217, for connection to helicopter wiring. Contained on the front fuse panel 224 are sixteen neon-type fuses, F1 through F16, used for circuit protection, four spare fuses, and an elapsed time indicator 214. Within the amplifier, there are eight plug-in modules AR1 to AR8 (AR4 shows as 219 in FIG. 2) with associated gain capsules (such as 220) as applicable. Also contained is a motor-tachometer generator 202.

In FIGS. 9–12, the connectors to the AFCS amplifier 200 are represented by dashed lines, generally shown on both the left and right sides, with single arrow heads pointing to the dashed lines to represent the mated plug and jack. Numbers or letters adjacent the arrow heads are the pin designations. The reference characters pointing to the dashed lines designate only one of the two mated connectors. Thus, the mated plug P200 and jack J200 are designated by the reference character P200. The reference P217 designates the mated plug P217 and jack J217. The plugs on the edges of the printed circuit modules Ar1 to AR8 mated with the receptacles in the amplifier cabinet are designated in FIGS. 8–12 as XAR1 to XAR8. The mated connectors for the gain capsules plugged into the modules are designated XA1 to XA5 and XA7. For module AR6 the corresponding connector is designated P198. Module AR8 has no gain capsule.

Standard Amplifier Module

Amplifier modules are identical and interchangeable for the following: pitch (AR1 and AR2), roll (AR3 and AR4), and yaw (AR7). Corresponding gain capsules, in general, are peculiar to each module and are not interchangeable by function. Portions of amplifier circuitry are not fully used in some functional applications. This is for module standardization, providing for interchangeability. Due to difference of usage of indentical modules, dependent upon function, a typical functional application is described. Reference designations in relation to system operation will be prefixed by module designation. For example, modules AR1 through AR4 and AR7 are identical. Taken out of the AFCS amplifier, the designation is meaningless. However, when within the amplifier as a package, each module is assigned a reference designation by function. The schematic diagram of this typical module is shown in FIG. 13 (comprising FIGS. 13A, 13B and 13C placed together).

Pitch Amplifier Module (AR1 and AR2)

Figure 9:
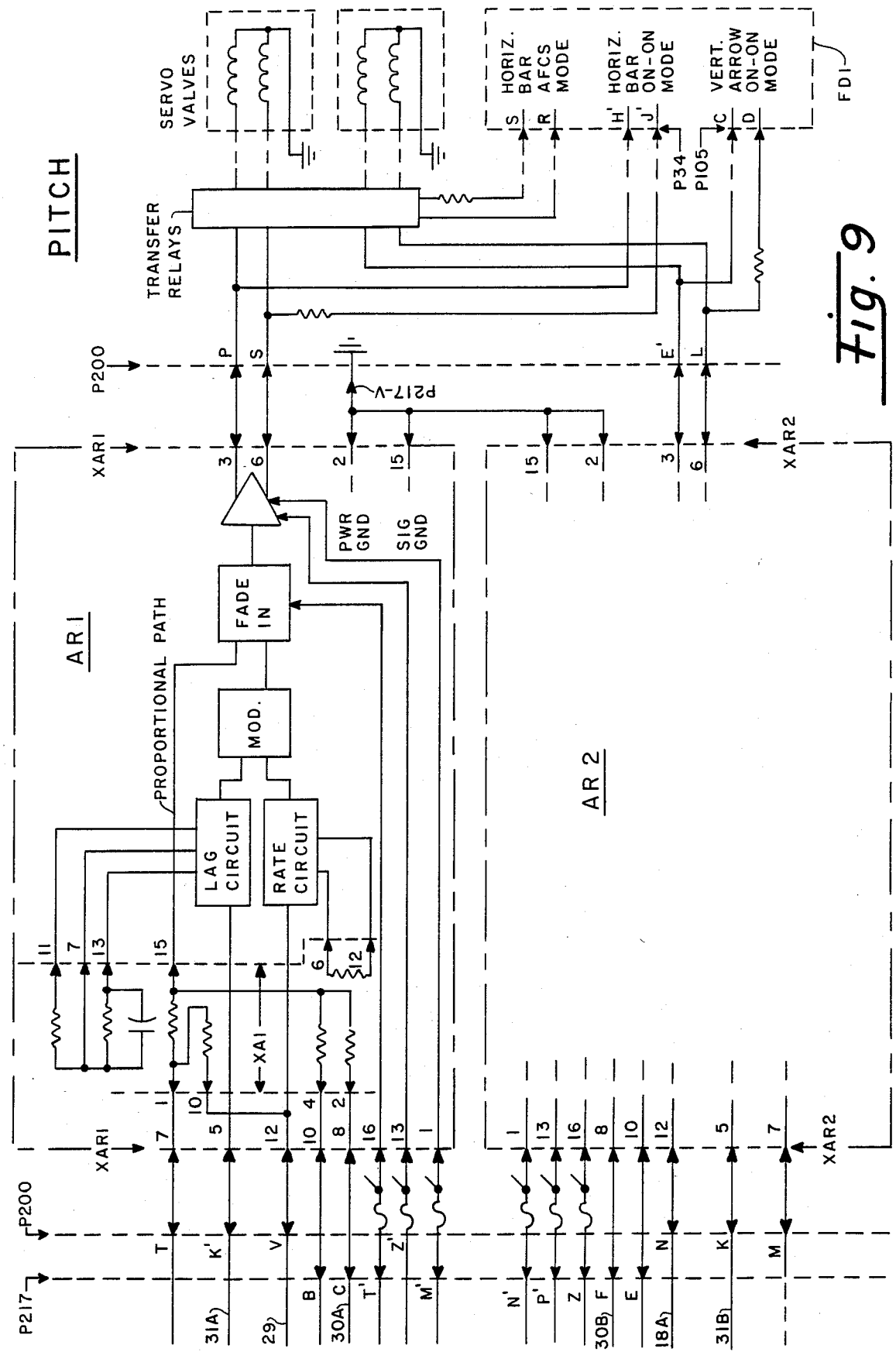

Discussion of AR1 and AR2 is identical. Modules AR1 and AR2 (pitch AFCS 1 and AFCS 2) represent redundant pitch circuitry. The connections to the amplifier and via connectors J200 and J217 to the rest of the system is shown in FIG. 9. FIG. 8 shows some of the related sensors of the system. In FIG. 9 the gain capsule is shown with connector XA1 for module AR1. The module AR2 and its gain capsule are the same, and therefore only the input and output connections are shown.

Referring to the components in the gain capsule by the two pin members of connector XA1, resistor 7-11 is 2.7 megohms, resistor 7-13 is one megohm, capacitor 7-13 is one microfarad, resistor 1-15 is 20,000 ohms, resistor 1-10 is 23,700 ohms, resistor 4-15 is 392,000 ohms, resistor 2-15 is 130,000 ohms, and resistor 6-12 is 53,600 ohms.

An AC signal on line 30, representing CG (center of gravity) trim is shown in FIG. 7. The "CG trim" circuit 721 is part of the AFCS control panel 701, the actual circuit being shown in FIG. 9. The signal for channel No. 1 on lead 30A is applied via pin P217-C (FIG. 9) to pin XAR1-8. The signal for channel No. 2 on lead 30B is applied via pin P217-F to pin XAR2-8.

An AC signal 29 representing actual pitch attitude (vertical gyro signal), referenced to a horizontal plane, is shown in FIG. 7 from the copilot vertical gyro (port) unit 720. The circuit is shown in FIG. 8. The signal on lead 29 is applied via pin P200-V to pin XAR1-12. The signal from the pilot's vertical gyro (starboard) unit 709 is shown in FIG. 7 applied via other units. In FIG. 8 the output signal is shown on lead 18A, which is applied via pin P200-N to pin XAR2-12.

The AC signal representing CG trim which appears at gain capsule pin XA1-2, and the vertical gyro signal which appears at pin XA1-10, are summed across a gain capsule resistive load to pin XA1-15 and applied to transformer 1T5, pin 6(FIG. 13). The vertical gyro signal at pin XAR1-12 is coupled by transformer 1T2 to a demodulator circuit comprised of diodes 1CR3, 1CR4, resistors 1R6 through 1R10. Potentiometer 1R8 is adjusted to provide for a balanced demodulator circuit. With no signal applied, potentiometer 1R8 is adjusted to produce a DC null signal output from the demodulator state. Capacitor 1C2 acts as a differentiator to provide a rate of pitch change, determined by charging and discharging, due to variation of DC signal. This provides a step input, approximating a square wave, to an amplifier circuit comprised of an operational amplifier 1A2, resistors 1R14, 1R15, 1R16 and capacitor 1C5. Potentiometer 1R15 is adjusted in a quiescent state to provide a null output and capacitor 1C5 provides a path for degenerative feedback. At this point, a DC pitch rate signal has been produced and is applied to the modulator circuit. The DC rate signal is changed to an AC rate signal with phase being dependent on output polarity of amplifier 1A2. The AC signal is now applied to transformer 1T5, pin 1.

An AC signal, representing pitch position sensor signal output is shown in FIG. 7 on line 31 from unit 722. In FIG. 8 the pitch position sensor circuit 722 with channel 1 output on lead 31A and channel 2 output on lead 31B. In FIG. 9, these signals are applied via pins P217-K' and P217-K to pins XAR1-5 and XAR2-5. This signal is applied to transformer 1T1, pin 7, coupled to a demodulator circuit comprised of diodes 1CR1, 1CR2, and resistors 1R1 through 1R5. Potentiometer 1R3 is adjusted to provide for a balanced demodulator circuit. With no signal input applied, resistor 1R3 is adjusted to produce a DC null signal output from the demodulator stage. Capacitor 1C1 is used as a ripple filter. The demodulated signal is applied through gain capsule (FIG. 9) (resistive load) XA1, pin 11 and out at XA1, pin 7. The signal is now applied to a gain amplifier circuit comprised of an operational amplifier 1A1, resistors 1R11, 1R12, 1R13 and capacitor 1C4. Potentiometer 1R12 is adjusted in quiescent state to provide a null output. Capacitor 1C4 provides a path for degenerative feedback. An AC signal representing a signal indicative of cyclic pitch setting is applied to the modulator circuit through resistor 1R19.

The modulator circuit, comprised of diodes 1CR11 and 1CR12, resistors 1R20, 1R21, and 1R22, modulates applied signals to produce an AC derived rate signal. Resistor 1R22 is adjusted to provide a balanced modulator circuit. With no signals applied, resistor 1R22 is adjusted to produce an AC null output across the primary of transformer 1T5. Modulator output, representing a resultant error signal, if any, is applied to the primary of transformer 1T5, pins 1 and 3. Error signal polarity is determined by phase relationship between error signal and phase of reference excitation voltage. The resultant rate of error signal is coupled across transformer 1T5, to the input of a fade-in circuit. At the same time, a proportional AC pitch error signal (amplitude of error at any time) modified by CG trim control at the gain capsule pin XA1-15 is applied to transformer 1T5, pin 6.

At the secondary of transformer 1T5, the rate of pitch error signal is summed and the resultant amplitude of error, at a rate of error change, is applied to the input of the fade-in circuit. The fade-in circuit, comprised of diodes 1CR13, 1CR14, 1CR15, resistors 1R24 through 1R26, and capacitor 1C9, provides for a fixed rate of signal growth regardless of signal amplitude. This prevents a large error signal from immediately being applied to external circuitry.

The signal output from the fade-in circuit is applied to transformer 1T6, pin 6. The transformer 1T6 primary is center-tapped to ground at pins 5 and 7. Resistor 1R46 provides a load to ground and completes a circuit path for the primary of transformer 1T6, at pin 4. The purpose of resistor 1R46 is to provide a load for provisional circuit wiring. Transformer 1T6 couples the proportional-plus-rate error signal to a three-stage voltage amplifier circuit comprised of transistors 1Q1, 1Q2, 1Q3, and related components. Capacitor 1C15 compensates for input signal phase shift and resistor 1R36 provides a path for degenerative feedback to establish amplifier gain. Capacitor 1C13 compensates for output signal phase shift. Transformer 1T7 couples the signal output from the voltage amplifier stages to power amplifier and demodulator stages.

The power amplifier state is comprised of transistors 1Q4 and 1Q5, arranged in a push-pull configuration, and related components. Resistor 1R41 and diode 1CR17 provide temperature stabilization for constant bias application to transistors 1Q4 and 1Q5, and capacitor 1C17 compensates for amplifier output signal shift.

The signal output of the power amplifier is applied to a demodulator circuit. This circuit applies a demodulated AC error signal to the flight director indicators providing a visual indication of the correction signal (FIG. 9). It also applies the correction signal to the applicable servo valve. The demodulator circuit is comprised of diodes 1CR18 through 1CR21 and the windings of transformer 1T8. Demodulator output is either at transformer 1T8, pin 4 or 7. Output at connector XAR1, pins 3 or 6, is applied directly to the servo valve. The output is via pins P200-P and S for module AR1 and via pins P200-E' and L for module AR2. Output, at either pin, is dependent upon phase of error signal input to demodulator. Capacitors 1C14 and 1C16 are filters, and diode CR24 acts as an output limiter, protecting the servo valve.

Necessary power for operation of stages within the amplifier module is 115 vac, ØB 400 cps, single phase; and 28 vdc. Single phase inputs are referenced to AC excitation ØB.

Power at 28 vdc is applied through connector XAR1, pin 16, when AFCS 1 is selected to key the fade-in circuit. This DC voltage is necessary to couple signal output from the modulator circuit through fade-in circuit to the voltage amplifier. When +28 vdc is not available any signal output from the modulator is blocked and no signal is applied through diodes 1CR13 and 1CR14 to transformer 1T6, pin 6. The 28 vdc operating voltage is applied through connector XAR1, pin 13, through resistor 1R39 to the cathode of Zener diode 1CR16. The resultant Zener voltage establishes B+ for operation of voltage amplifier stages, transistors 1Q1, 1Q2, and 1Q3 and power amplifier transistors 1Q4 and 1Q5.

The 115 vac is applied through connector XAR1, pin 1 to the primary winding of transformer 1T9 for application to the modulator circuit and rectifier circuit. It is also applied to the primary winding of transformer 1T8 for application to the power amplifier demodulator circuit and for application to the initial demodulator circuits. Transformers 1T8 and 1T9 are the same part number with secondary windings 09-9 at 15.5 volts, 8-6 at 45 volts, 29-14 at 23 volts, and 3-5 at 45 volts.

The rectifier circuit, excited through secondary windings of transformer 1T9, is comprised of diodes 1CR7 through 1CR10, and Zener diodes 1CR5 and 1CR6. This circuit with diodes 1CR5 and 1CR6 establishes a DC bias for operation of operational amplifiers 1A1 and 1A2.

Connectors XAR1 or XAR2 pin inputs and outputs are as follows: Pins not mentioned are not used.

| XAR1 or XAR2 | USAGE |
| --- | --- |
| 1 | 115 vac, excitation |
| 2 | Signal ground |
| 3 | Output to servo valve and flight director indicator |
| 5 | Input from pitch position sensor |
| 6 | Output to servo valve and flight director indicator |
| 7 | Output to line test set |
| 8 | Input from CG TRIM control |
| 12 | Input from vertical gyro |
| 13 | 28 vdc, operating voltage |
| 15 | Power ground |
| 16 | 28 vdc, to key fade-in |

Roll Amplifier Modules (AR3 and AR4)

Modules AR3 and AR4 are identical; AR3 and AR4 (roll AFCS 1 and 2 respectively) represent redundant roll circuitry. Functional usage of roll circuitry within either module is identical to either pitch module except that CG trim path is not used, there is no derived rate signal for vertical gyro input, and roll rate gyro #1 and #2 signals are fed into the position sensor path and processed in the same manner as the position sensor signal. Connectors XAR3 and XAR4 pin inputs and outputs are as follows: Pins not mentioned are not used.

| XAR3 or XAR4 | USAGE |
|---|---|
| 1 | 115 vac, excitation |
| 2 | Signal ground |
| 3 | Output to roll servo valve and flight director indicator |
| 5 | Input from roll rate gyro |
| 6 | Output to servo valve and flight director indicator |
| 8 | Input from vertical gyro |
| 13 | +28 vdc, operating voltage |
| 15 | Power ground |
| 16 | +28 vdc, to key fade-in |

Figure 10:
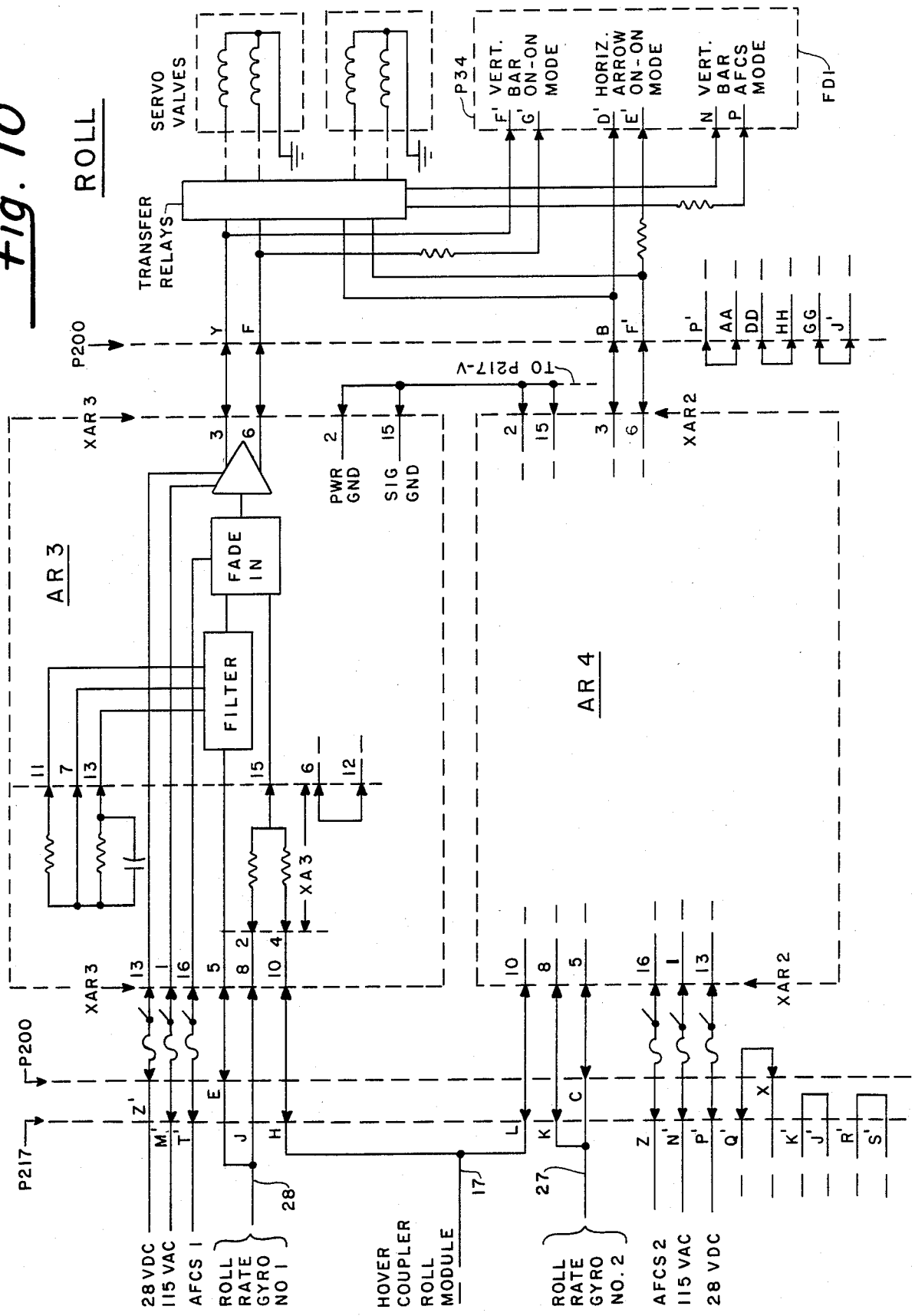

In FIG. 10 the gain capsule is shown with connector XA3 for module AR3. The module AR4 and its gain capsule are the same, and therefore only the input and output connections are shown.

Referring to the components in the gain capsule by the two pin numbers of connector XA3, resistor 7-11 is 536,000 ohms, resistor 7-13 is one megohm, capacitor 7-13 is 4.7 microfarad, resistor 2-15 is 49,000 ohms, resistor 4-15 is 536,000 ohms, and connection 6-12 is a short circuit.

FIG. 7 shows the output signals 28 and 27 of roll rate gyro #1 (719) and roll rate gyro #2 (718) supplied to modules AR3 and AR4. In FIG. 10, the signal on line 28 is applied both via pin P217-J to pin XAR3-8 and via pin P200-E to pin XAR3-5. In like manner the signal on line 27 is applied both via pin P217-K to pin XAR4-8, and via pin P200-C to pin XAR4-5.

The inputs shown in FIG. 10 as AFCS 1 and AFCS 2 applied via pins P217-T' to pin XAR3-16, and P217-Z to pin XAR4-16 are shown in FIG. 8 from part of the AFCS control panel. The connections to pins 1, 13 and 16 of connector XAR1 are connected to corresponding pins of connector XAR3 following the fuses; and the corresponding pins of connectors XAR2 and XAR4 are also connected together.

Figure 12:
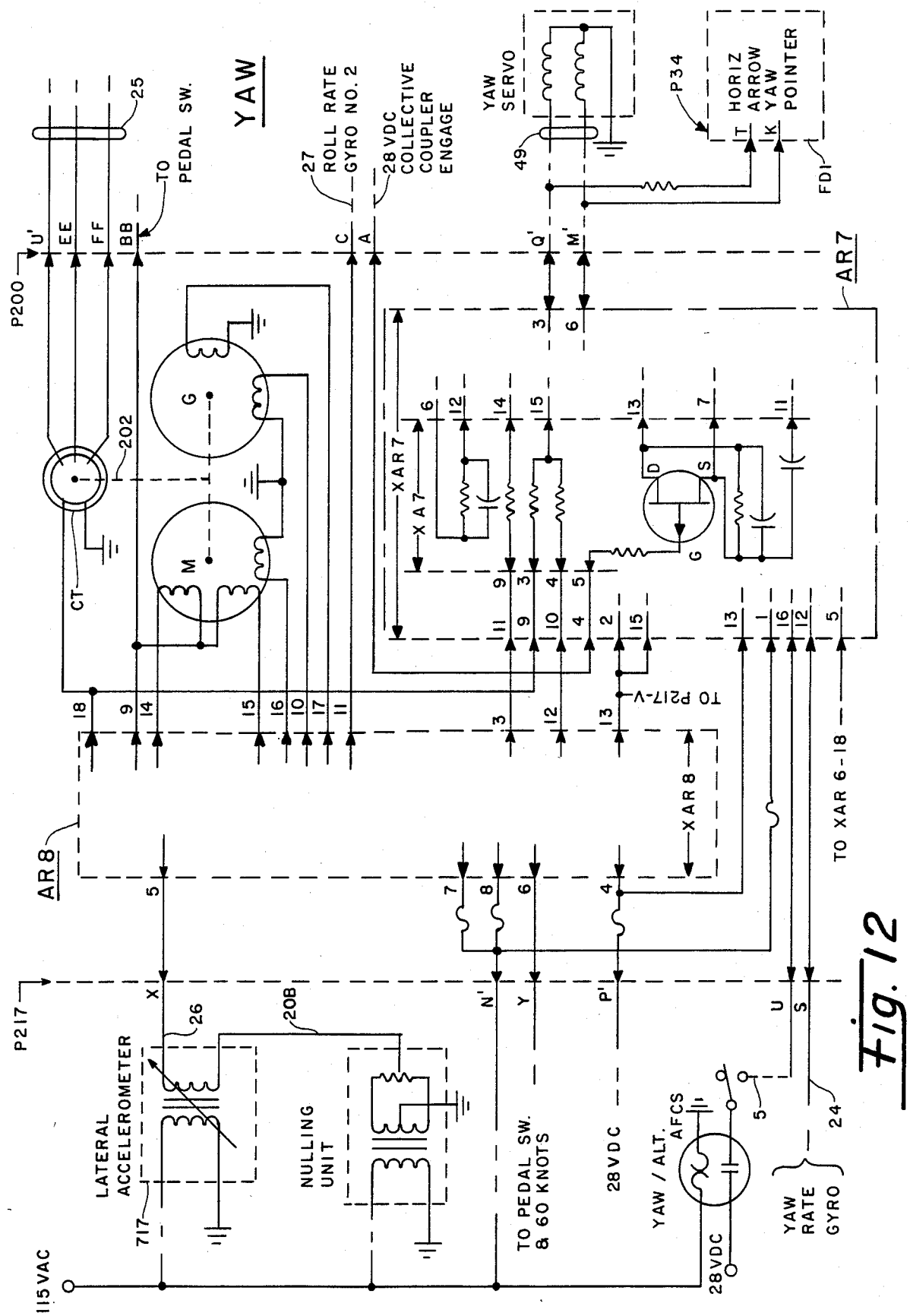
Figure 13A:
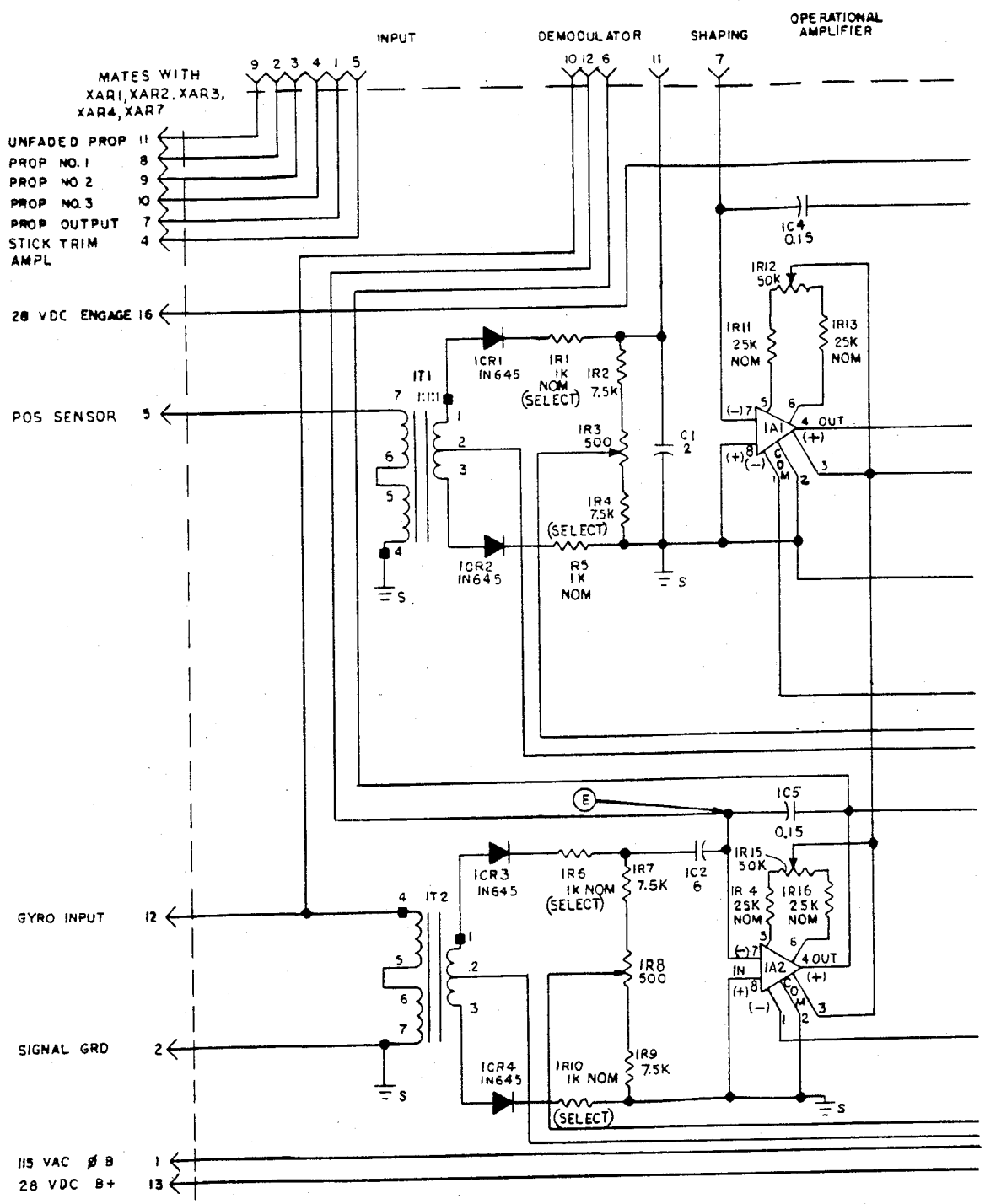
FIGS. 13A-13D (together referred to as FIG. 13) comprise a schematic diagram of a common amplifier module which may be used for either of two pitch modules, either of two roll modules, or a yaw module.
Figure 13B:
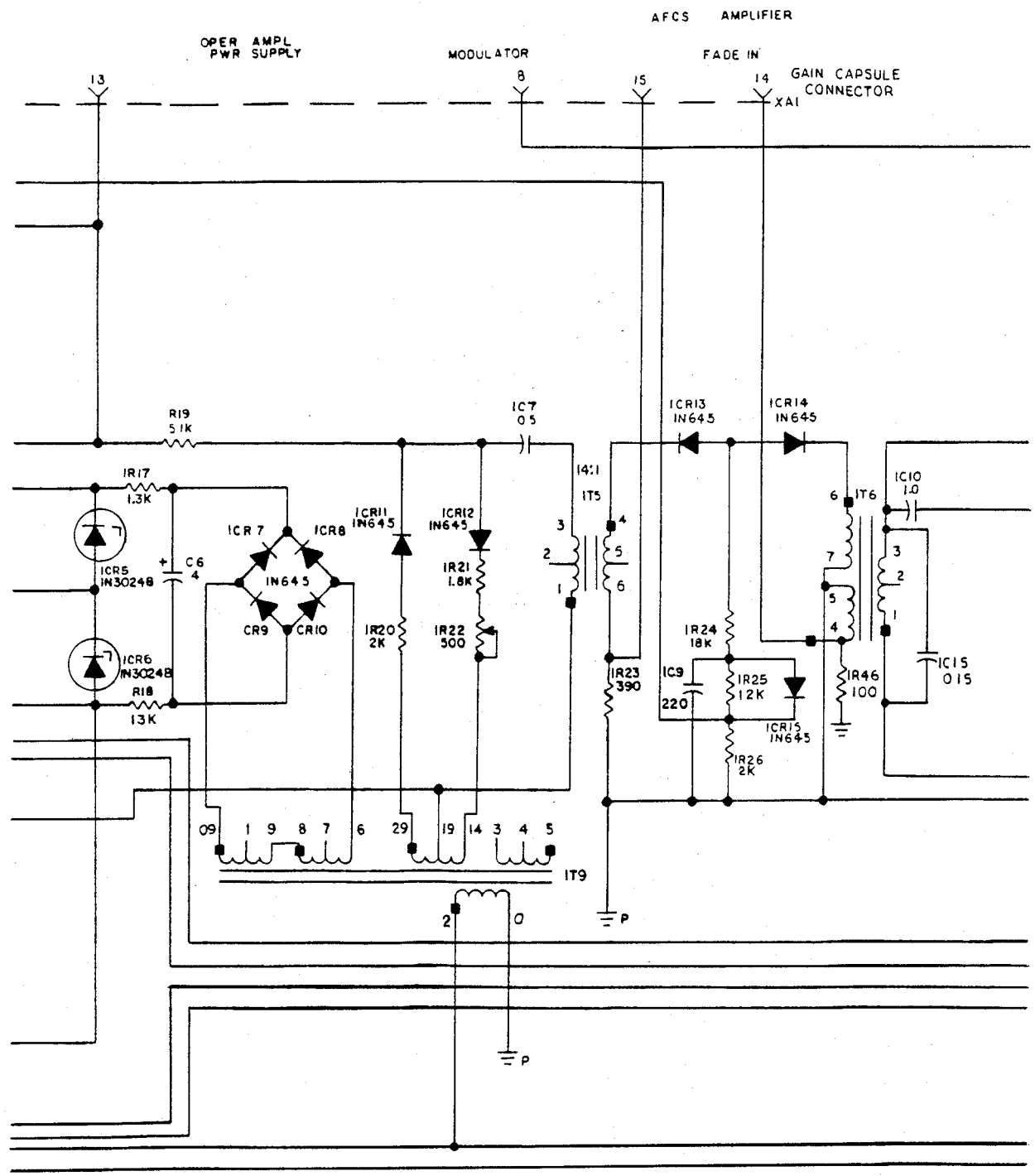
Figure 13C:
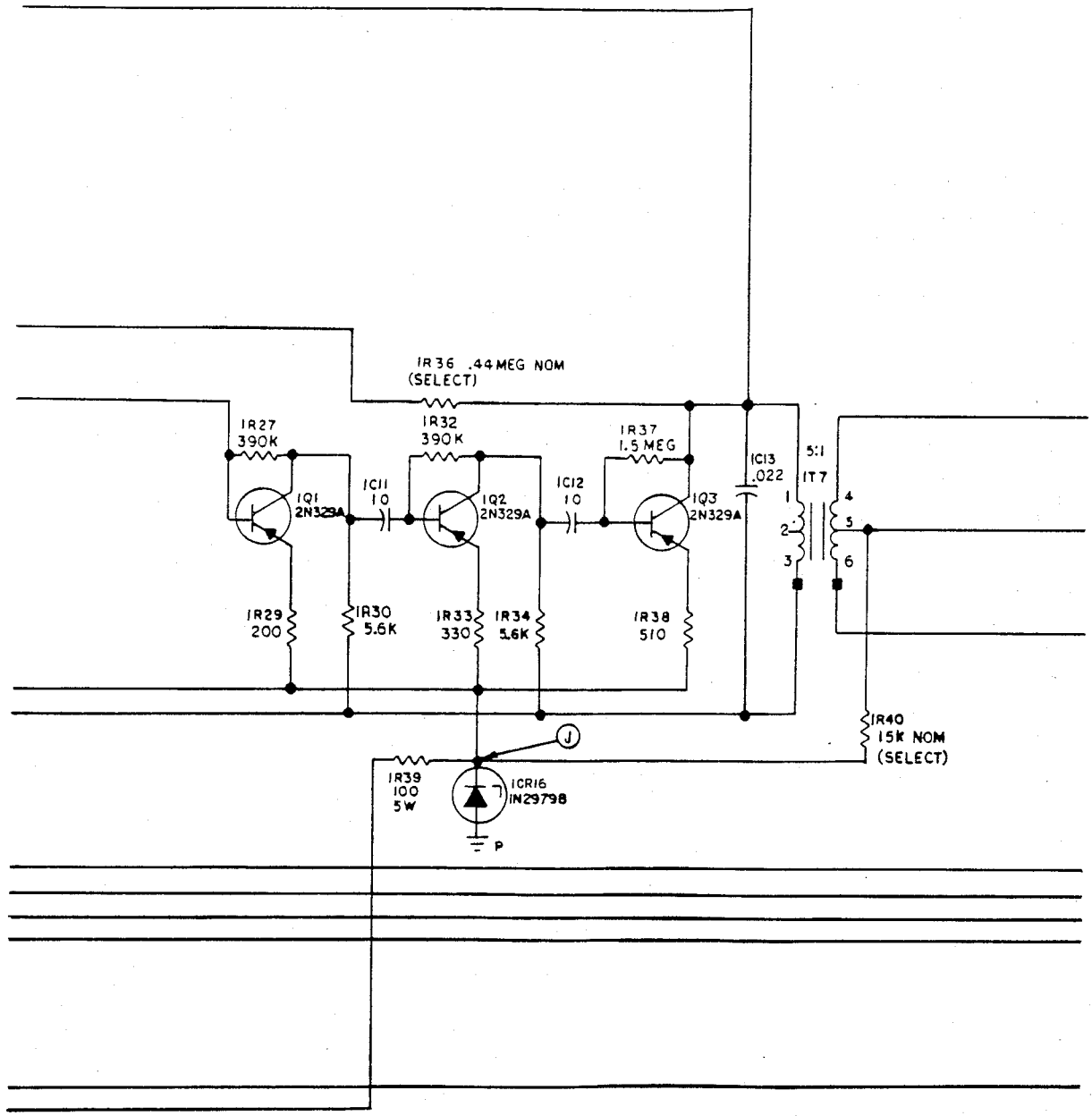
Figure 13D:
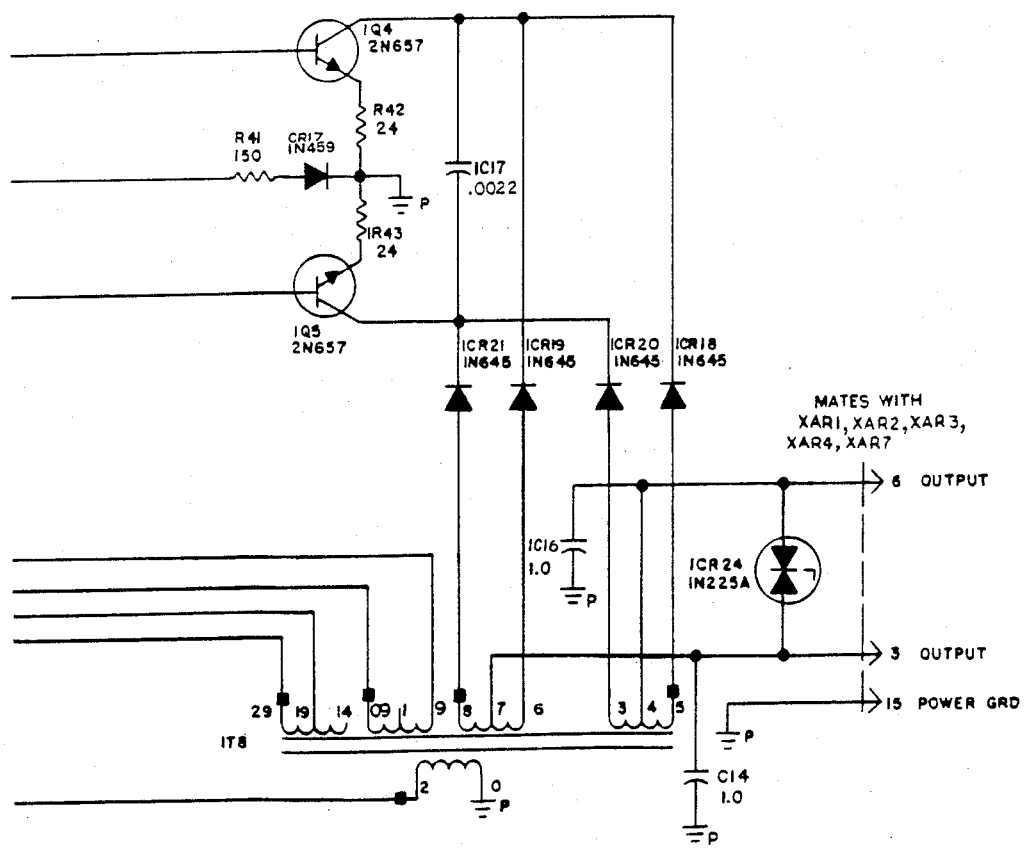

FIG. 7 shows a signal on line 17 from roll module XA1B of the hover coupler 712. In FIG. 12 this signal is applied via pin P217-H to pin XAR3-10, and also via pin P217-L to pin XAR4-10.

The outputs from module AR3 at pins XAR3-3 and 6 are supplied via pins P200-Y and F to the servo valves and flight director indicators. The corresponding outputs from module AR4 are supplied via pins P200-B and F'.

Altitude Module

Figure 14A:
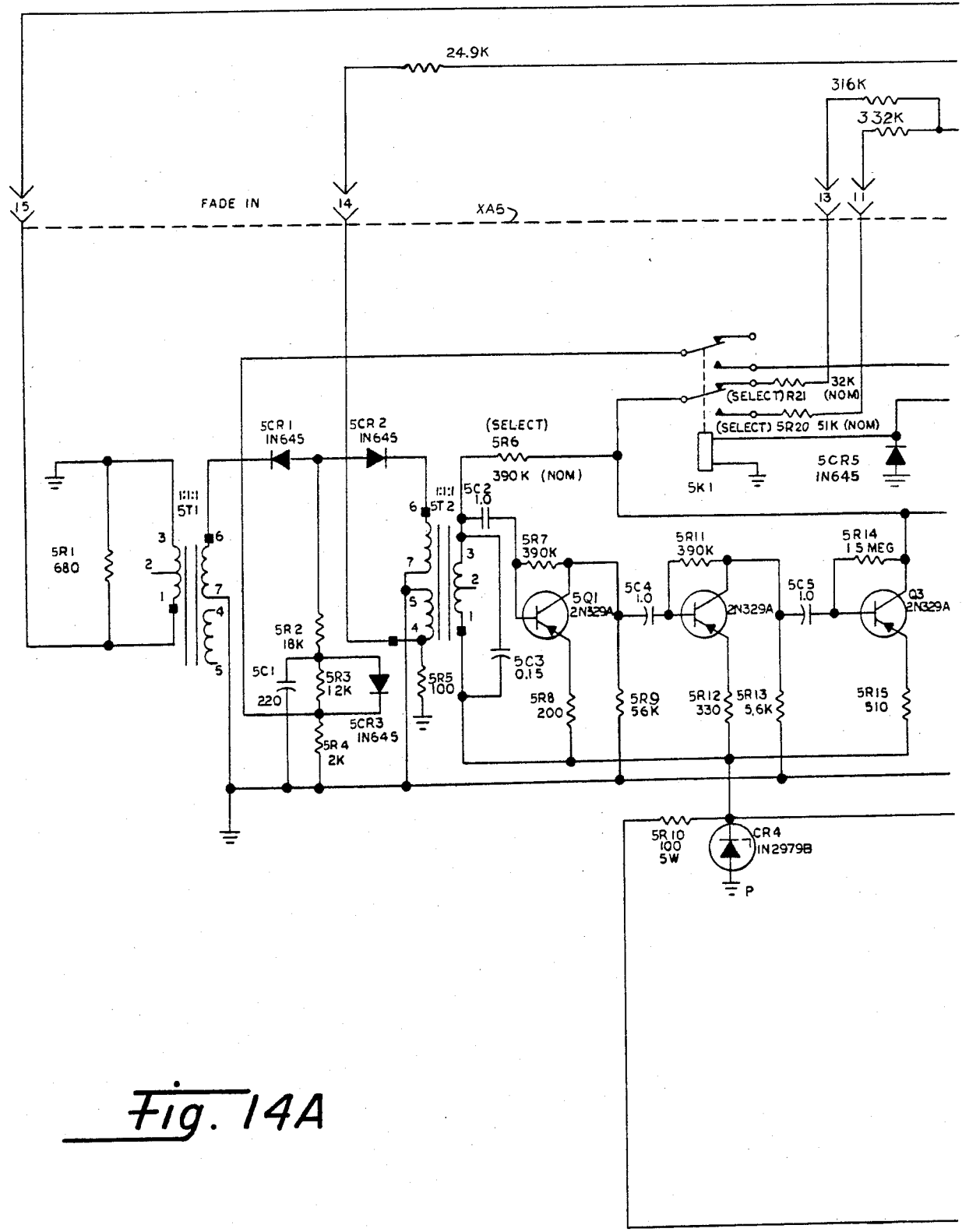
FIGS. 14A-14B (together referred to as FIG. 14) comprise a schematic diagram of the amplifier altitude module.
Figure 14B:
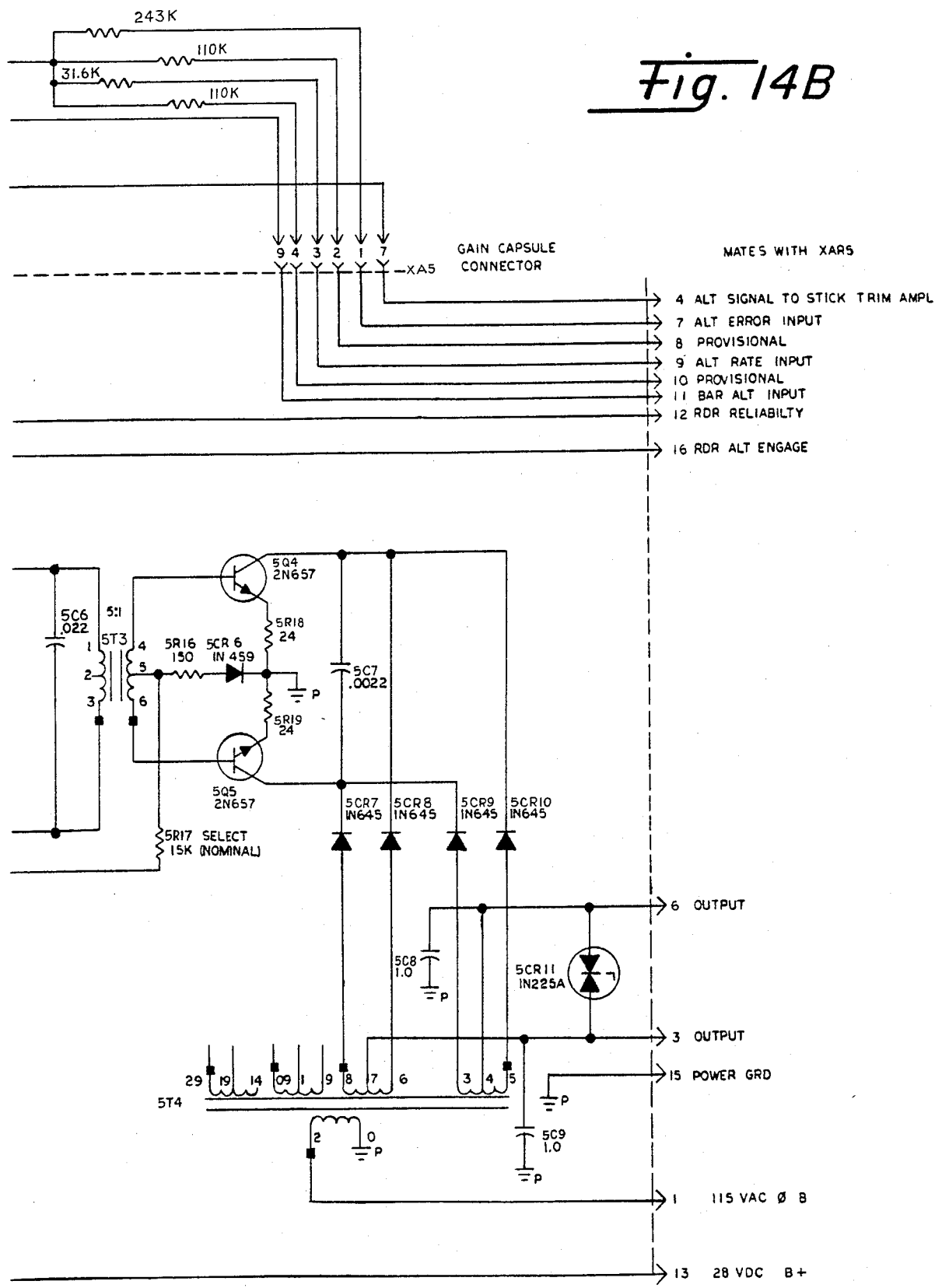

Circuitry in module AR5 (FIGS. 11 and 14) is the same as the similar circuitry in the pitch and roll amplifier modules. In FIG. 14 the gain capsule is shown above its connector XA5. The circuitry of module AR5 includes fade-in, voltage amplifier, push-pull power amplifier, and demodulator. The only circuitry difference is the addition of relay 5K1. Relay 5K1 de-energized removes keying voltage from the fade-in circuit. It also routes voltage amplifier output from transformer 5T3, pin 1 to gain capsule connector XA5, pin 13, through a resistive load and out connector XA5, pin 7 to connector XAR5, pin 4 and to the stick trim amplifier. Relay 5K1 is energized when RDE ALT is engaged. This now applies keying voltage from radar reliability circuit through contacts of relay 5K1 to key fade-in. Also voltage amplifier output is now coupled to connector XA5, pin 11, through resistive load and out connector XA5, pin 7, to connector XAR5, pin 4 and to the stick trim amplifier. Connector XAR5 pin inputs and outputs are as follows: Pins not mentioned are not used.

| XAR5 | USAGE |
|---|---|
| 1 | 115 vac, excitation |
| 2 | Signal ground |
| 3 | Output to flight director indicator and altitude servo valve |
| 6 | Output to flight director indicator and altitude servo valve |
| 7 | Radar altitude error signal input |
| 9 | Radar altitude rate signal input (Vz) if selected |
| 11 | Altitude controller (BAR ALT) input signal if selected |
| 12 | 28 vdc, radar reliability |
| 13 | 28 vdc, operating voltage |
| 15 | Power ground |
| 16 | 28 vdc, RDR ALT engage |

Altitude Integrator Module (AR6)

Figure 15A:
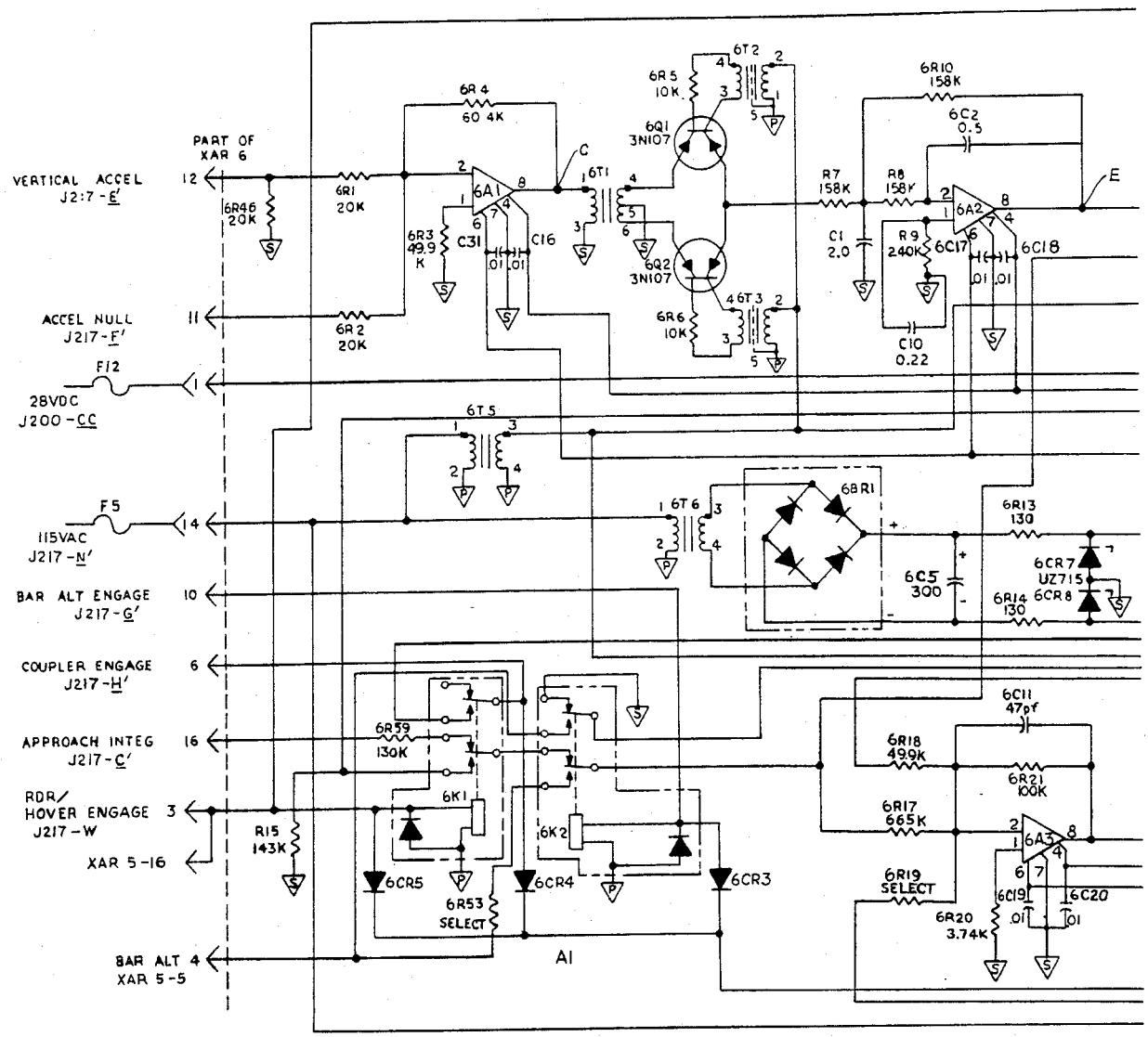
FIGS. 15A-15C (together referred to as FIG. 15) comprise a schematic diagram of the amplifier altitude integrator module.
Figure 15B:
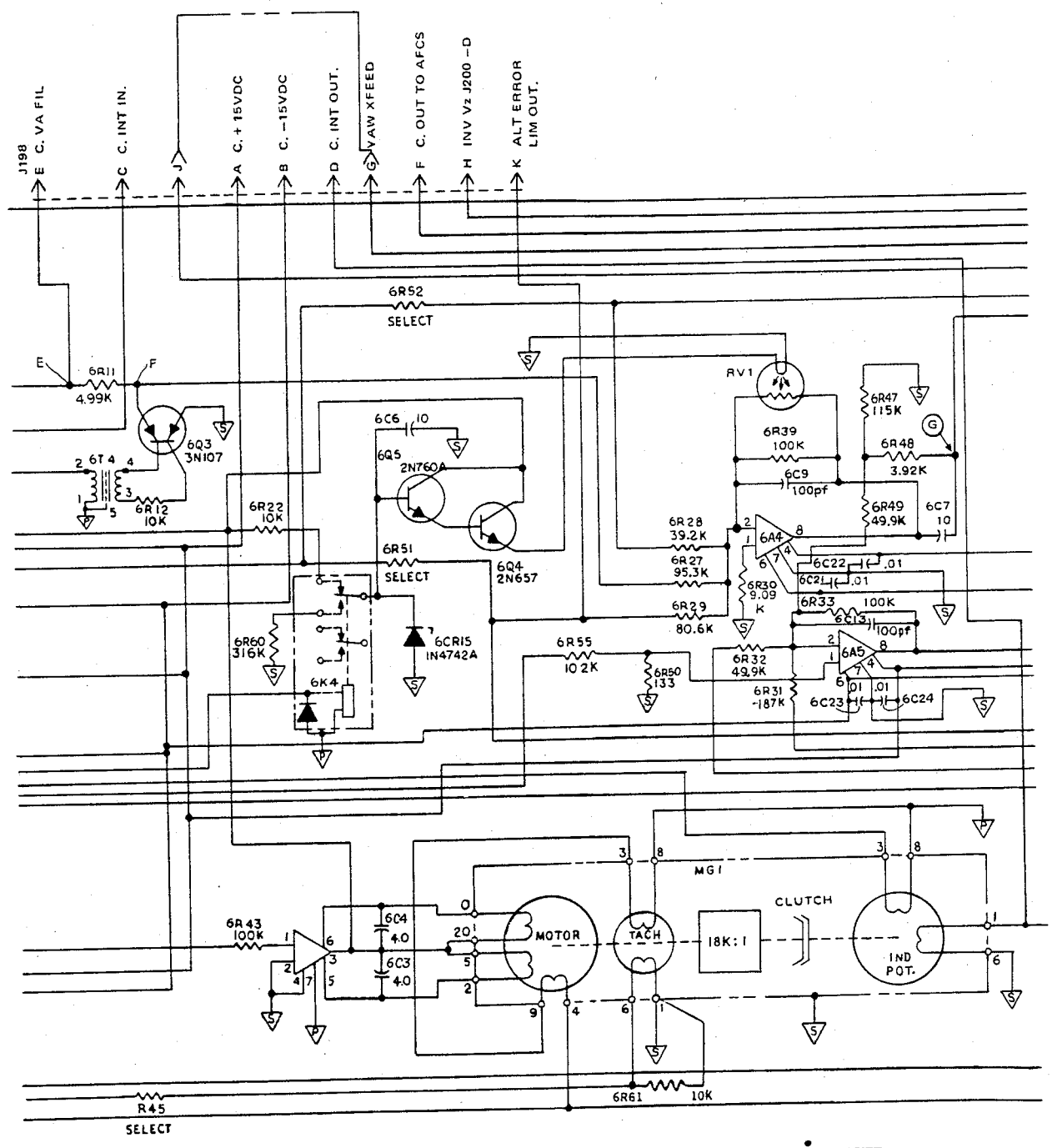
Figure 15C:
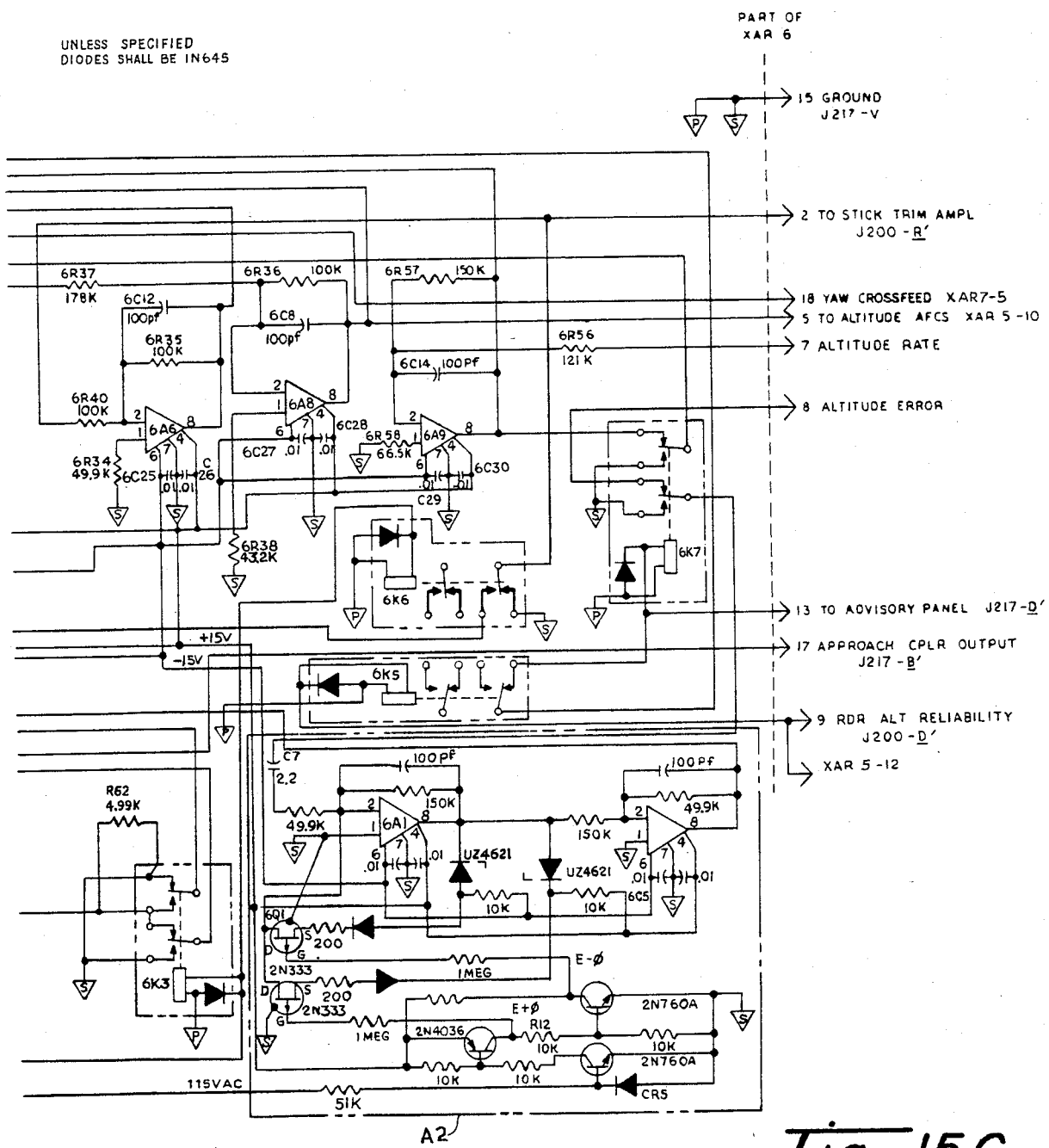

The altitude integrator module AR6 (FIGS. 11 and 15) provides signals to the altitude coupler. The altitude coupler applies programmed rate of descent signals to the stick trim system and AFCS in the approach mode and hover signals to the stick trim and AFCS system to provide for accurate altitude retention in the hover modes.

The vertical accelerometer signal on lead 23 from unit 714 is applied via pin P217-E' to pin XAR6-12. The accelerometer output signal is in phase with respect to phase B during up acceleration and during decreases in downward velocities. The signal is routed through resistor 6R1 and summed with the vertical accelerometer null signal on lead 20A from nulling unit 711 via pins P217-F' and XAR6-11 to the input of operational amplifier 6A1. The null signal is adjusted so that it is equal in amplitude but opposite in phase to any accelerometer output during zero acceleration states. This is required to counteract gravity forces or inherent characteristics of the accelerometer which would tend to provide false output information to AFCS. The summing of the accelerometer and the null signal results in a tracked accelerometer signal which represents true acceleration of the helicopter. The tracked accelerometer signal is phase inverted and amplified by operational amplifier 6A1 by a factor 3.02. The resultant amplified signal is applied to demodulator circuitry consisting of transformers 6T1 through 6T3, transsistors 6Q1, 6Q2, resistors 6R5 and 6R6. Transformer 6T1 provides for an impedance of amplifier 6A1 and the lower input impedance of the demodulator. It also provides two oppositely phased inputs to the demodulator which permits full wave demodulation. With an out-of-phase voltage at test point C the output of the demodulator will be a positive pulsating DC voltage. Integrated chopper (inch) transistors 6Q1 and 6Q2 alternately conduct during each half cycle of the input shorting the appropriate transformer 6T1 secondary output to resistor 6R7. Resistor 6R7 is the input to filter amplifier 6A2 and associated circuitry. Low pass filter 6A2 filters out all frequencies above approximately 1 Hz to prevent accelerometer vibratory signals from affecting the AFCS system. The inverted output of the filter is modulated in reference to phase B by transsistor 6Q3, transformer 6T4 and resistors 6R11 and 6R12. With a negative potential at test point E the modulator will alternately open and short test point F to ground. The resultant output signal will be an out-of-phase voltage in respect to phase B. The output of the modulator is applied to the inverting input of amplifier 6A4 through resistor 6R27.

Summed with the modulator output is the doppler altitude rate signal on lead 11 from unit 704 and the radar altimeter altitude error signal on lead 9 from unit 703. The altitude rate signal is applied via pin P200-C' and normally open contacts B of relay K2 to pin XAR6-7. From connector XAR6 the signal is routed through resistor 6R56 to the inverting input of amplifier 6A9. The amplified output of amplifier 6A9 is routed to normally closed contacts of relay 6K7. Relay 6K7 is deenergized with radar altimeter on and reliable. During reliable radar altimeter operation the altitude rate signal is routed through resistor 6R28 and to the inverting input of amplifier 6A4. The altitude error signal routed from lead 9 via pin P200-T', normally open contacts A of relay K2 and pin XAR6-8, is applied directly to normally closed contacts of relay 6K7 to the limiter circuitry on submodule A2. The limiter circuitry limits the error voltage to approximately 1.5 vac to prevent a sudden loss of altitude when engaging the coupler or radar altimeter. The output of the limiter circuitry is routed through resistor 6R29 to the inverting input of amplifier 6A4. Connected across the input and output of amplifier 6A4 is raysistor RV1, which acts as a fade-in/fade-out circuit by changing the value of feedback resistance of amplifier 6A4.

With the coupler engaged in the approach mode and the altimeter reliable or in the hover mode, 28 vdc is applied via pin P217-W to pin XAR6-3. From pin 3 the voltage is routed to the solenoid of relay 6K1 which energizes and routes 28 vdc coupler engage voltage from pin XAR6-6 to the solenoid of relay 6K4, which energizes relay 6K4. In a deenergized state relay 6K4 applies a positive potential to diode 6CR15 and the base of transistor 6Q5. Zener diode 6CR15 limits the voltage at the base of transistor 6Q5 to 12.0±0.6 vdc. A positive potential at the base of transistor 6Q5 causes transistor 6Q5 to conduct which in turn causes transistor 6Q4 to conduct. The voltage at the emitter of transistor 6Q4 is kept at approximately 11 vdc which is applied across raysistor RV1. The light source within raysistor RV1 illuminates which in turn causes the resistance of the photoresistor to decrease. The low value feedback resistance of amplifier 6A4 causes the gain to decrease to approximately zero. If relay 6K4 is energized, transistors 6Q5 and 6Q4 are cut off and raysistor RV1 increases its resistance to a very high value where only resistor 6R39 has an effect on the gain of the stage. Capacitor 6C6 is placed in the circuit to slowly discharge from 12.0 vdc and slowly turn off transistors 6Q5 and 6Q4. In turn the output of amplifier 6A4 is increased from zero to its maximum value in a predetermined time interval. The output of amplifier 6A4 is routed into two paths. The first path through resistor 6R37 is applied to the inverting input of amplifier 6A8. Amplifier 6A8 provides for a gain of 0.562. The output is applied through pin XAR6-5 to the altitude module where the signal is processed further and applied to the AFCS servo valve. The second path is routed to voltage divider network resistors 6R47 and 6R48. From the voltage divider the attenuated signal is routed through resistor 6R49 to the inverting input of amplifier 6A5. With the coupler engaged, the vertical velocity and limited altitude error signals are summed, routed through the integrator circuitry and applied to the inverting input of amplifier 6A5. The integrator compensates for steady state aerodynamic disturbances by providing an output sufficiently large to reposition the collective stick to maintain the helicopter at the desired altitude.

The approach coupler output from the approach coupler 705 is routed through pin 17 of connector XAR6 and through resistor 6R32 where it is summed with the altitude signal from amplifier 6A4 and the integral altitude error signal. The output of amplifier 6A5 is routed through normally open contact of relay 6K6 to pin XAR6-2 and to the inverting input of amplifier 6A6. From pin XAR6-2 the altitude signal is routed via pin P200-R' and lead 32 to the stick trim amplifier 730 as an outer loop altitude signal.

The yaw cross feed path is routed through amplifier 6A6 which amplifies the input signal by a factor of one. The output of amplifier 6A6 goes out at pin P198-G and returns to pin P198-J, and then is supplied via pin XAR6-18 to pin XAR7-5 of the yaw module AR7. The crossfeed path is required to maintain helicopter heading at the termination of an approach due to the increased collective force required to stop the descent.

| XAR6 | USAGE |
|---|---|
| 1 | +28 vdc, operating voltage |
| 2 | Output to stick trim amplifier |
| 3 | +28 vdc RDR/HOV engage input signal |
| 4 | Input signal from barometric altimeter |
| 5 | Output to altitude channel |
| 6 | +28 VDC COUPLER ENGAGE INPUT SIGNAL |
| & | Altitude rate input signal |
| 8 | Altitude error input signal |
| 9 | +28 vdc RDR ALT reliability input signal |
| 10 | +28 vdc BAR ALT engage input signal |
| 11 | Input from accelerometer nulling unit |
| 12 | Input from vertical accelerometer |
| 13 | +28 vdc output to advisory panel |
| 14 | 115 vac excitation |
| 15 | Ground |
| 16 | Input from approach integrator |
| 17 | Input from approach coupler |
| 18 | Output to yaw channel |
| J198 | USAGE |
| A | +15 vdc power supply output |
| B | −15 vdc power supply output |
| C | Input from integrator |
| D | Output from integrator |
| E | Output from vertical accelerometer |
| F | Output to altitude channel |
| G | Output to yaw channel |
| H | Output from doppler |
| J | Yaw channel input |
| K | Output from altitude error limiter |

Yaw Amplifier Module (AR7)

Module AR7 circuit design is identical to either pitch or roll amplifier modules (FIG. 13). However, operational amplifier circuit 1A1 is not used. The gain capsule with connector XA7 is shown in FIG. 12. Referring to the components by the XA7 pin numbers, resistor 6-12 is 600,000 ohms, capacitor 6-12 is 6.0 microfarads, resistor 9-14 is 18,200 ohms, resistor 3-15 is 210,000 ohms, resistor 4-15 is 205,000 ohms, resistor 5-G is one megohm, resistor 7-13 is 931,000 ohms, capacitor 7-13 is 4.7 microfarads, capacitor 7-11 is 6.0 microfarads and the transistor is type 2N3331. Connector XAR7 pin inputs and outputs are as follows: Pins not mentioned are not used.

| XAR7 | USAGE |
|---|---|
| 1 | 115 vac, excitation |
| 2 | Signal ground |
| 3 | Output to flight director indicator and yaw servo valve |
| 6 | Output to flight director indicator and yaw servo valve |
| 9 | Input heading error signal from control transformer |
| 10 | No. 2 roll rate gyro input |
| 11 | Input (lateral accelerometer) from XAR8, pin 3 |
| 12 | Input from yaw rate byro |
| 13 | 28 vdc, operating voltage |
| 15 | Power ground |
| 16 | 28 vdc, to key fade-in |

Yaw Synchronizer Module (AR8)

Figure 16A:
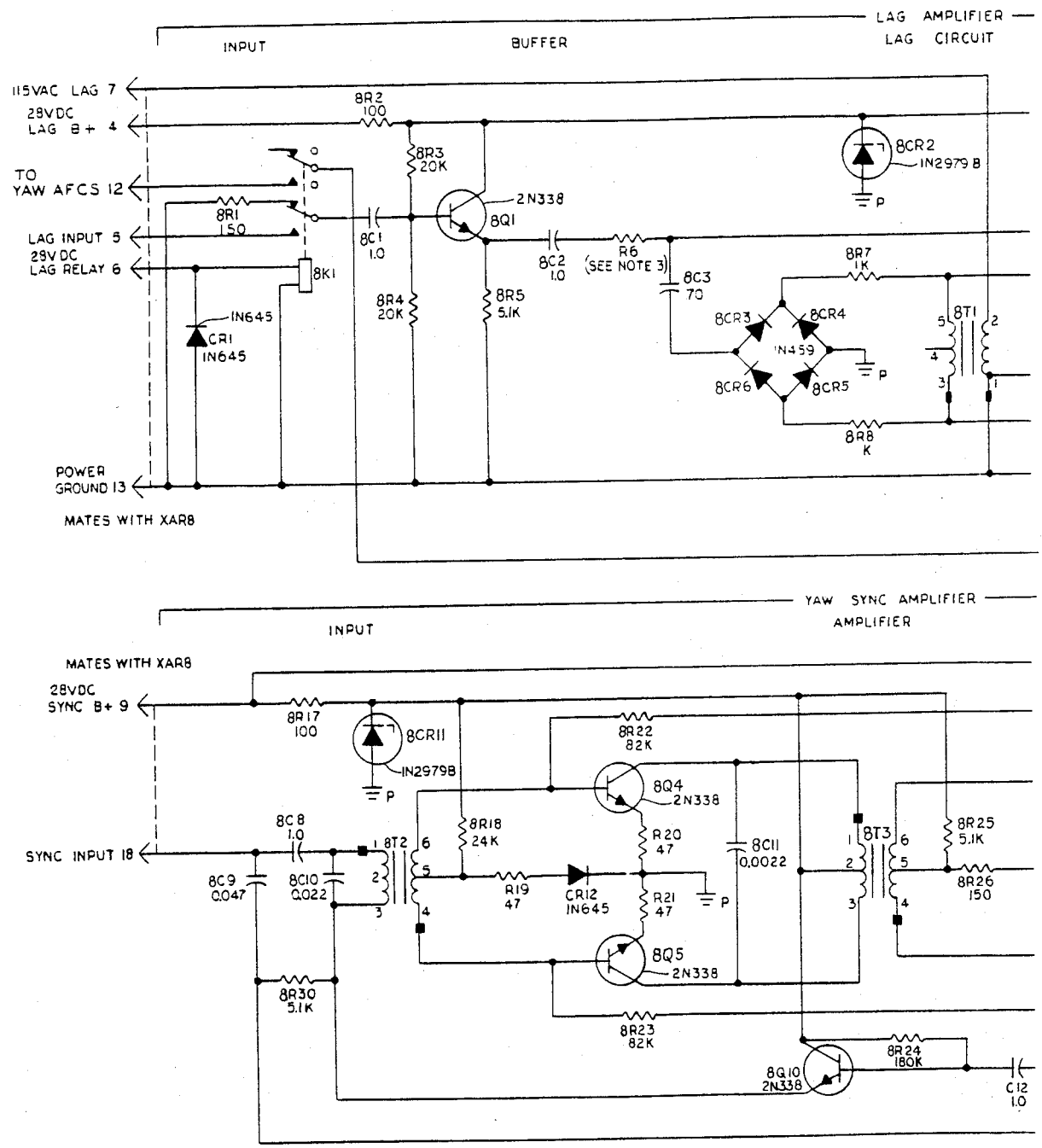
FIGS. 16A-16B (together referred to as FIG. 16) comprise a schematic diagram of the amplifier yaw synchronizer module.
Figure 16B:
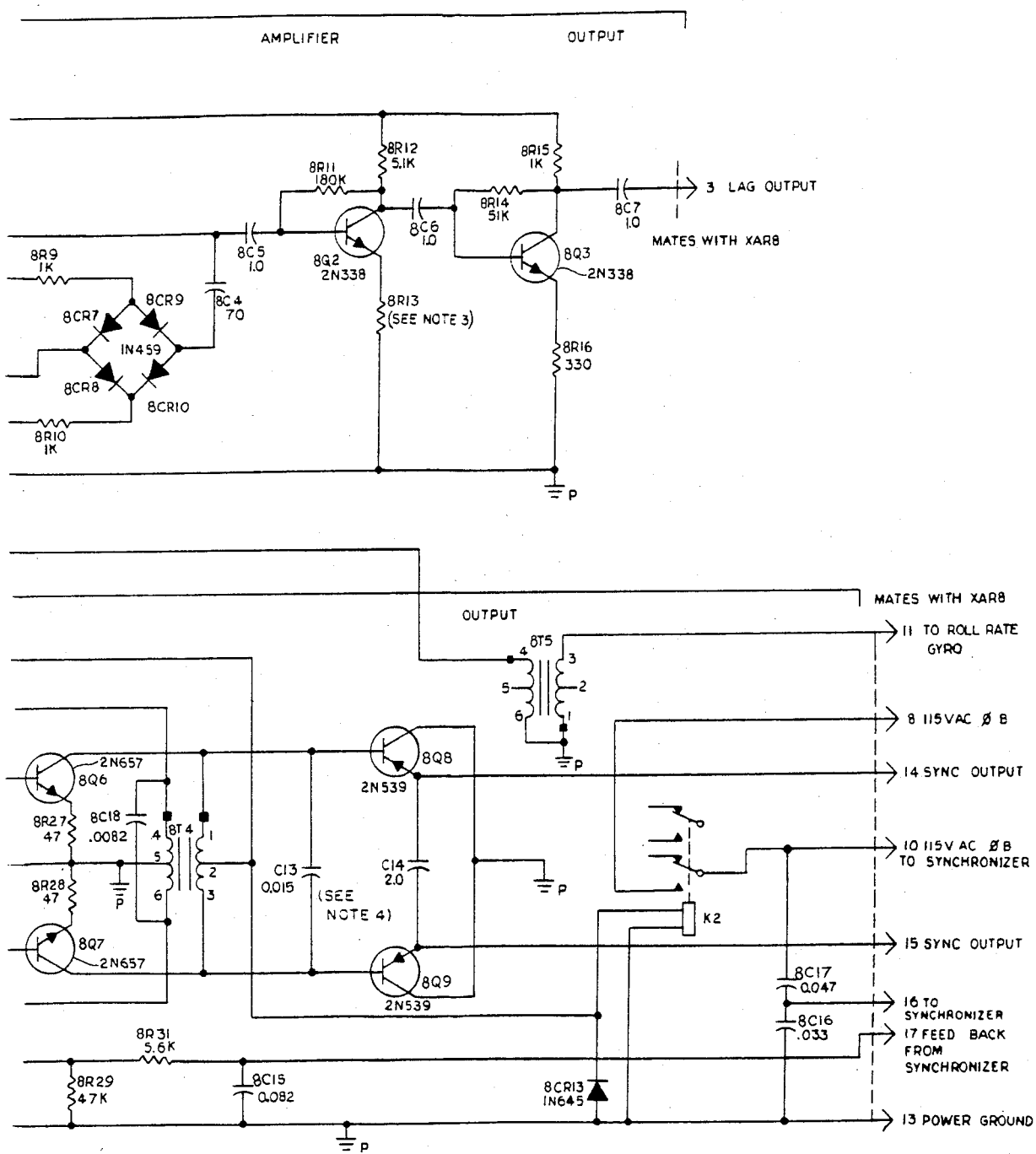

The yaw synchronizer module AR8 (FIGS. 12 and 16) is used for synchronization. Synchronization takes place during a manual turn or coordinated turn mode of yaw channel operation. Control circuitry within the module controls application of excitation voltage to the motor and tachometer generator.

During a manual turn, using rotary rudder pedals, synchronizing mode of operation is in effect. The heading signal is constantly applied from the control transformer CT through pin XAR8-18 and coupled by capacitor 8C8 to transformer 8T2, pin 1. Capacitor 8C10 corrects for phase shift. Control DC voltage is applied from pin P200-BB, when rotary rudder pedals are used, through pin XAR8-9 through resistor 8R17 to diode 8CR11. Zener 8CR11 establishes operating bias for amplifier dircuitry. Prior to resistor 8R17, the DC voltage is supplied to energize relay 8K2. Normally open contacts of relay 8K2 supply AC excitation voltage from pin XAR8-8 for generator G, through pin XAR8-10 and for the motor M, through pin XAR8-16.

With the heading signal at transformer 8T2, pin 1, a path exists through resistor 8R30 to ground. The signal is coupled across transformer 8T2 to the base of transistors 8Q4 and 8Q5 arranged in a push-pull configuration. Diode 8CR12 and resistor R19 provide for temperature bias stability for transistors 8Q4 and 8Q5. Collector output is applied to transformer 8T3, pins 1 and 3. Capacitor 8C11 corrects for phase shift; transformer 8T3 couples the signal to an amplifier comprising transistors 8Q6 and 8Q7, also in push-pull configuration. Transistors 8Q6 and 8Q7 output is applied to base of transistors 8Q8 and 8Q9, and to primary of transformer 8T4; which couples the signal into a feedback path to base of transistors 8Q4 and 8Q5. Emitter output of transistors 8Q8 and 8Q9 is applied through pins XAR8-14 and XAR8-15 to be applied as signal inputs to drive the motor M.

Prior to signal application to transistors 8Q8 and 8Q9, the same signal is applied to transformer 8T4, pins 1 and 3. Capacitor 8C13 corrects for phase shift, and transformer 8T4 couples the signal back to the input of transistors 8Q4 and 8Q5 as degenerative feedback. Also, as the servo motor M drives, the generator G is mechanically driven and supplies a signal voltage through pin XAR8-17 to be base of emitter follower transistor 8Q10. The emitter output of transistor 8Q10 is applied to transformer 8T2, pin 3 as degenerative feedback.

As servo motor M is driven by the heading signal as represented by output at pins XAR8-14 and XAR8-15, the servo motor M mechanically positions the control transformer CT rotor. This forms a closed loop action which effectively is represented as a null for any heading signal input versus output from the control transformer (CT). As a result, no heading signal error is applied to yaw amplifier module pin XAR7-9.

During a coordinated turn, DC control voltage is applied from pin P217-Y through pin XAR8-6 to energize relay 8K1. Normally open contacts of relay 8K1 provide a path for a lateral acceleration signal from unit 717 via pin P217-X through pin XAR8-5 through capacitor 8C1 to the base of emitter follower transistor 8Q1. During coordinated turn operation, DC control voltage is applied via pin P217P' through pin XAR8-4 to Zener diode 8CR2, establishing bias for amplifier stages. Transistor 8Q1 output is coupled and lagged through capacitor 8C2 and resistor 8R6. Two in-line modulator bridges are keyed by reference 115 vac ØB through transformer 8T1. Capacitor 8C3 or 8C4 charges and discharges the signal dependent on phase of accelerometer signal with respect to reference phase B, as the respective modulator bridge is keyed by reference ØB. This provides a filter-type action, filtering unwanted signals to ground. These signals may result from transient helicopter motion which could cause increasing signal builtup in the lateral accelerometer circuit. The resultant turn signal is coupled through capacitor 8C5 to the base of transistor 8Q2. Resistor 8R11 provides for degenerative feedback and the collector output is coupled through capacitor 8C6 to the base of transistor 8Q3; resistor 8R14 provides for degenerative feedback and the collector output of transistor 8Q3 is coupled through capacitor 8C7 to pin XAR8-3 as coordinated turn signal output.

Connector XAR8 pin inputs and outputs are as follows: Pins not mentioned are not used.

| XAR8 | USAGE |
|---|---|
| 3 | Output to XAR7, pin 11 (lateral acceleration) |
| 4 | 28 vdc, operating voltage |
| 5 | Input from lateral accelerometer |
| 6 | 28 vdc, to energize K1 |
| 7 | 115 vac, lag circuit excitation |
| 8 | 115 vac, excitation |
| 9 | 28 vdc, operating voltage and energizes K2 |
| 10 | Output, 115 vac to generator, B1 |
| 11 | No. 2 roll rate gyro input |
| 12 | Roll rate gyro output |
| 13 | Power ground |
| 14 | Output to motor B1 for synchronizing |
| 15 | Output to motor B1 for synchronizing |
| 16 | Output, 115 vac to motor B1 |
| 17 | Input from generator B1 for synchronization feedback |
| 18 | Input heading signal from control transformer B1 |

Gain Capsules

Six gain capsules are in the AFCS amplifier. A gain capsule is assigned to all amplifier modules (AR1 through AR5 and AR7) except the yaw synchronizer module (AR8). In general, gain capsules establish amplifier gains and provide for signal summation points. Each gain capsule fits into slots provided on the rear side of each applicable module. The gain capsule fits into a module mounted receptable and is locked in place.

Gain capsules for modules AR1 and AR2 (pitch No. 1 and No. 2 respectively) are interchangeable. Gain capsules for modules AR3 and AR4 (roll No. 1 and roll No. 2 respectively) are interchangeable Due to physical size similarity, care must be taken to insert the correct gain capsule into the associated module.

Motor-Tachometer Generator

The motor-tachometer generator 202 (servo motor-generator) is in the AFCS amplifier (FIGS. 2 and 12). The servo motor-generator contains windings for control transformer CT, a motor M, and a generator G. It also contains a gear box for a ratio of 84:1 reduction between the control transformer and servo-motor. It is used in the AFCS yaw channel.

Control transformer stator windings constantly receive heading information from the compass system 716 via line 25. Control transformer rotor windings represent transformer output to the AFCS yaw channel. Control transformer output is maintained at null during yaw channel synchronization by action of the servomotor-generator portion.

During a manual or coordinated turn, synchronization takes place. This provides for a closed loop between servomotor-generator and control transformer, resulting in a null signal output from the control transformer. This action occurs for the duration of the turn.

Fuses

There are 20 neon-type fuses on the fuse panel 224 on the front of the AFCS amplifier. Sixteen fuses, designated F1 through F16, are in-line used for circuit protection. Four fuses are used as spares. All fuses are ½ ampere. Circuit protection is as follows:

| REFERENCE DESIGNATION | CIRCUIT |
| --- | --- |
| F1 | Motor and tachometer generator 202 excitation - AC |
| F2 | B+ for yaw synchronizer and yaw amplifier modules - DC |
| F3 | Excitation for yaw synchronizer module lag circuit (T1) - AC |
| F4 | Coordinated turn relay 8K1 in yaw synchronizer module DC |
| F5 | XAR6 - AC |
| F6 | B+ for altitude amplifier module - DC |
| F7 | Elapsed time indicator and excitation for pitch No. 1 and roll No. 1 modules - AC |
| F8 | B+ for pitch No. 2 and roll No. 2 modules - DC |
| F9 | Excitation for pitch No. 2 and roll No. 2 modules (T8 and T9) - AC |

Component Deck Assembly 231

During altitude approach or hover engage modes of operation relay K2 (FIG. 11) is energized. The radar altimeter and doppler signals are fed through the energized contacts of relay K2 to the altitude module AR5 and the altitude integrator module AR6. Relay K1 is energized when the radar altimeter is inoperative or the collective stick trim system is engaged. When relay K1 is energized the radar altimeter and the doppler outputs are removed from the altitude module AR5.

Interlock Circuits

The system provides a number of interlock circuit loops through the connectors. Those included on the AFCS amplifier 200 chassis wiring for plugs P200 and P217 are shown in FIG. 10.

TEST OPERATION

A subsequent section describes the test procedures and results. This section explains the operation of the tester (FIG. 4) and the simulation of aspects of the system, when those procedures are followed. These sections should be read together.

PITCH CHANNEL

A. Pitch Vertical Gyro In

Switches S1 and S2 for AFCS 1 and AFCS 2 simulate switches AFCS 1 and AFCS 2 shown in FIG. 8 to apply 28 volts DC to pins P217-T' and P217-Z.

In the flight director indicator FDI, with the switch 301 in position "O", pin P34-A is connected through a resistor, the horizontal flag coil, and another resistor, and pin P34-E to ground, which retracts the horizontal flag 307. Pin P34-P is connected through a resistor, the vertical flag coil, and to the ground side of the horizontal flag coil, which retracts the vertical flag 306. When the switch is operated to the "A" position pins P34-C and P34-D are connected via the respective resistors to the coils for the horizontal and vertical flags, and the other ends of the two coils in common are connected via the resistor to pin P34-E. In the "O" position the coil for the horizontal bar 302 is connected to pins P34-H' and J', and the coil for the vertical arrow 305 is connected to pins P105-C and D, as shown in FIG. 9. The servo valves of FIG. 9 are simulated by resistors R1T to R4T.

Connection of the AC signal source to the jacks for pins P200-N and P200-V simulates signals from the vertical gyros 709 and 720 in FIG. 8. In FIG. 5, potentiometer R24T is moved upward for plus phase $(+\phi)$ and downward for minus phase $(-\phi)$.

B. Stick Position Sensor

Connection of the AC source to the jacks for pins P200-K and P200-K' simulates signals on line 31 from the pitch position sensor 722 in FIG. 8.

C. Center of Gravity Trim

Connection of the AC source to the jacks for pins P200-C and P300-F simulates signals on line 30 (FIG. 8) from part of the AFCS control panel.

D. Coupler In

Connection of the AC source to jacks for pins P217-B and P217-E simulates signals from the hover coupler 712 (FIG. 7A), pitch module XA1B to two conductors of line 22.

ROLL CHANNEL

In the flight director indicator FDI in the "O" or On-On mode, the coil for the vertical bar 303 is connected to pins P34-F' and G' and the coil for the horizontal arrow 304 is connected to pins P34-D' and E', as shown in FIG. 10. The servo valves of FIG. 10 are simulated by resistors R5T and R8T.

A. Roll Rate Gyro In—Filtered

Connection of the AC signal source to the jacks for pins P200-C and E simulates signals on lines 28 and 27 from the roll rate gyros 719 and 718.

B. Roll Rate Gyro In—Unfiltered

Connection of the AC source to jacks for pins P217-J and K also simulates signals from the roll rate gyros 719 and 718.

C. Coupler In

Connection of the AC source to jacks for pins P217-H and L simulates signals on line 17 from the hover coupler roll module.

YAW CHANNEL

Operation of the flight director indicator switch to the "A" position for the AFCS mode connects the coil for the horizontal arrow 304 to pins P34-T and K as shown in FIG. 12. The servo valves in FIG. 12 are simulated by resistors R11T and R12T.

A. Simulated Heading Inputs

Operation of the yaw switch S3 connects 28 volts DC to pin P217-U, which simulates the yaw/alt AFCS switch of the AFCS control panel, shown in FIG. 12.

The heading simulator of FIG. 6 is variable with a control knob calibrated in degrees. Its output simulates the signals on the three conductors of line 25 to the control transformer CT. Engaging the yaw sync switch S4 simulates pedal switch operation to apply 28 volts DC to pin P200-BB, and also via a diode between terminals 9 and 11 of board TB6 to pin P217-Y.

B. Lateral Accelerometer Inputs

Connection of the AC signal source to the jack for pin P217-X simulates the signal on line 26 from the lateral accelerometer 717.

Engaging the coordinated turn switch S5 applys 28 volts DC to pin P217-Y to simulate operation of the pedal and 60 knots.

C. Roll Rate Gyro Input

Connection of the AC source to the jack for pin P200-C simulates the signal on line 27 from the roll rate gyro No. 2.

D. Yaw Roll Gyro Input

Connection of the AC source to the jack for pin P217-S simulates the signal on line 24 from the yaw rate gyro.

ALTITUDE CHANNEL

Figure 11:
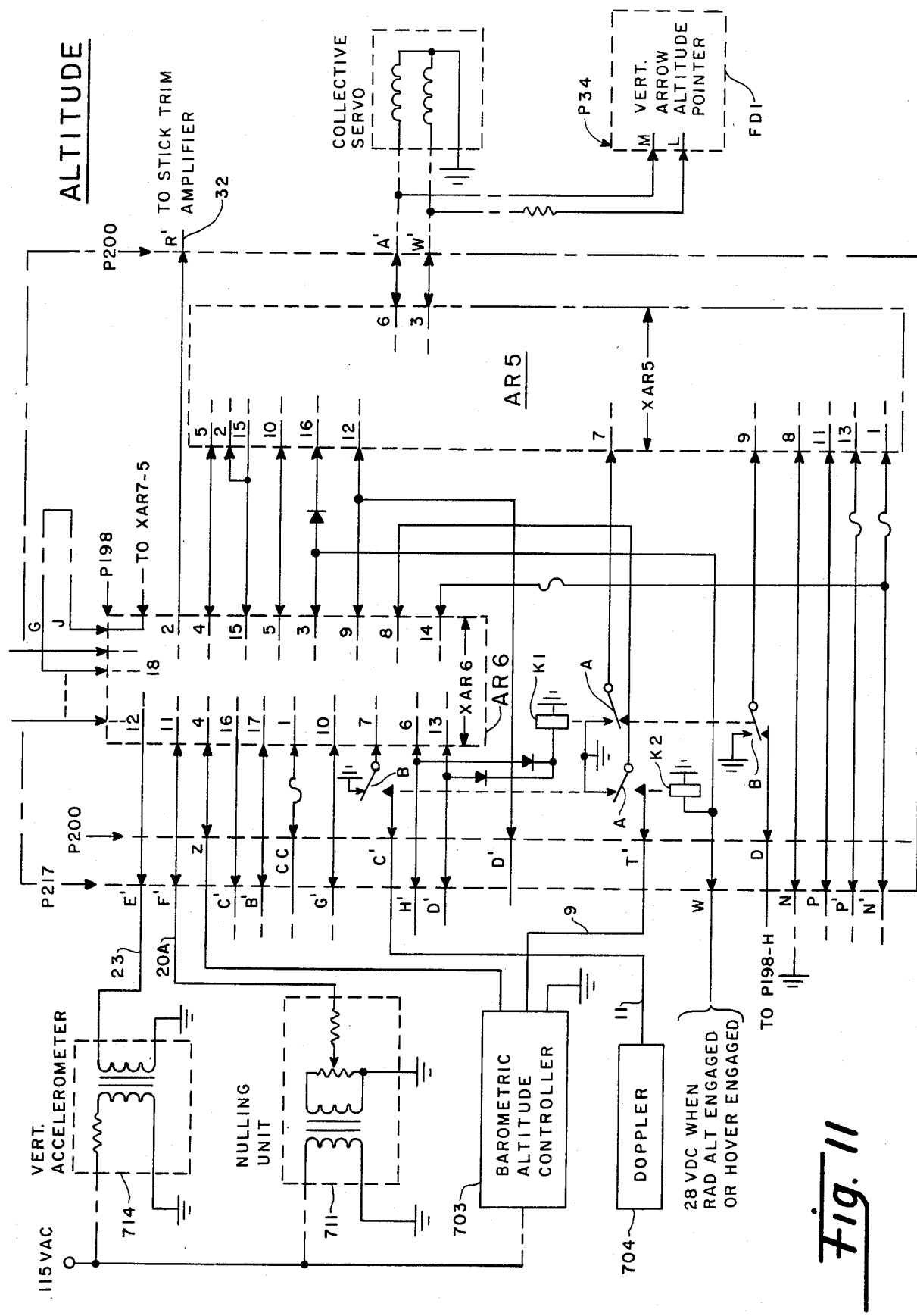

With the flight director indicator switch in the "A" position for the AFCS mode pins P34-M and L are connected to the coil for the vertical arrow 305, as shown in FIG. 11. The collective servo valves are simulated by resistors R9T and R10T.

A. Barometric Altitude Mode

Engaging the Bar/Alt switch S6 applies 28 volts DC to pin P217-G' to simulate the barometric altimeter engagement.

Connection of the AC source to the jack for pin P217-P simulates an altimeter error signal output from the barometric altitude controller 703. Connecting a meter to the jack for pin P198-D will permit reading the signal at pin 1 of the indicating potentiometer of the device MG1 in FIG. 15B. Connecting a meter to the jack for pin P200-R' permits reading the signal across resistor R13T which simulates the input of the stick trim amplifier.

B-1. Radar Altimeter Mode

Engaging the Rad/Alt switch S7 applies 28 volts DC to pin P217-W to simulate radar altimeter engaged or hover engaged. Engaging the Rad/Alt Rel switch S8 applies 28 volts DC to pin P200-D', which is a radar altimeter reliability signal.

Connection of the AC source to the jack for pin P200-T' simulates an altitude error signal from the barometric altimeter controller 703. Connecting a meter to the Jack for pin P198-K permits reading the altitude error limiter output signal.

B-2. Radar/Altimeter Doppler Rate Signal

A jumper between the jacks for pins P198-H and P200-D simulates a normal connection to normally closed contacts of relay K1, which extends to pin XAR5-9. Connection of the AC source to the jack for pin P200-C' simulates a signal on lead 11 from the doppler unit 704.

C. Coupler Mode

C-1. Radar Altimeter Error

Engaging the coupler switch S9 applies 28 volts DC to pin P217-H' and also to pin P200-A, which simulates a collective coupler engaged inputs to modules AR6 and AR7. The voltage at pin P217-H' also operate relay K1.

A jumper between the jacks for pins P198-G and J simulates the normal yaw cross feed connection.

C-2. Doppler Rate

All of the simulations have been described above.

C-3. Vertical Accelerometer In

Connection of the AC source to the jack for pin P217-E' simulates a signal on line 23 from the vertical accelerometer 714.

C-4. Null Box In

Connection of the AC source to the jack for pin P217-F' simulates the signal on lead 20A from the nulling unit 711.

AFCS AMPLIFIER CHECKOUT USING THE AMPLIFIER TESTER

This test checks all functional operations of the AFCS amplifier. It will certify the amplifier suitable for installation in the aircraft with only minor adjustments required to marry the amplifier to the aircraft systems.

EXPLANATION OF TERMS

For the purpose of this test the following terms will be used in relation to AFCS indicator responses.

DEADBEAT: A condition wherein the indicator moves in unison with the signal input, indicating no lagging, rate, or other modification of signal.

SLIGHT LAG: A condition wherein the indicator movement follows the input signal when moved slowly, but indicates a slight overshoot when the input knob is moved rapidly then stopped abruptly LAG: A condition wherein the indicator movement significantly lags the signal inputs as a result of an integrating circuit.

INTEGRATION: A voltage change at a selected test point caused by the integrator motor running to vary the signal.

YAW X FEED: A signal fed into the yaw channel from another channel.

If, during the test there is an indication of a faulty module or other component, unit should be removed and a bench test be performed on that component.

EQUIPMENT REQUIRED

1. One high impedance AC/DC multimeter (for ease of operation two meters may be used).
2. A source of 400 Hz, wye connected, 3 Phase, 115 volt AC power.
3. A source of 28 volts DC power.

PERFORMANCE

1. Open the lid of the amplifier and inspect for any visible damage.
2. Pull all modules out of the amplifier and check for moisture in the chassis. If moisture is present use a blow gun or other suitable method and thoroughly dry the chassis.
3. Reinstall the modules.
4. Connect the electrical cables (4 each) from the test set to the amplifier. (P-200, P-217, P-198, and P-908 are marked for easy identification.)
5. Connect the AC and DC power cables to the proper power sources.
6. Pull the fuses from the front of the amplifier and check that the proper fuse failure indicator lights illuminate.
7. Allow the amplifier to warm up for at least 10 minutes prior to functional checks being performed. While the amplifier is warming up perform continuity checks on the following interlock circuits utilizing the test jacks on the tester.

P200-X to P217-Q', P200-J' to P200-GG, P200-P' to P200-AA,

P200-DD to P200-HH, P217-J' to P217-K', P217-R' to P217-S',

8. All signals inputs to test jacks are jumpered from the AC signal source.

Smaller signals of 500 MV or less can be more easily adjusted by using the "X.01" scale on the power source.

Signals in the 500 MV to 2 volt range should be adjusted using the "X.1" scale, and Signals larger than 2 volts can be adjusted using the "X 1" scale.

| PROCEDURE | RESULTS |
|---|---|
| PITCH CHANNEL | |
| A. PITCH VERTICAL GYRO IN | |
| 1. Position Flight Director Indicator to "O" mode. | On-On appears in window of Flight Dir. Indicator. |
| (Note: Indicator remains in "O" mode throughout pitch and roll checks.) | |
| 2. Engage AFCS 1 & 2 switches. S1 & S2. | Both off flags in FDI retract |
| (Note AFCS 1 & 2 switches remain on throughout pitch and roll checks.) | |
| 3. Adjust applicable resistor 1R22 on pitch and roll modules for null indication on FDI. | Both pointers and both bars in FDI indicate null. (center) |
| 4. Connect AC meter to output jacks of signal source 2. | |
| 5. Jumper P200-N to P200-V. | |
| 6. Jumper signal source 2 to P200-V. | |
| 7. Adjust sig. source 2 +∅ for 800 MV on AC meter. | FDI pitch pointer 305 and bar 302 both indicate 3 ± .5 divisions up. |
| 8. Adjust sig source 2 −∅ for 800 MV on AC meter. | FDI pitch pointer and bar indicate 3 ± .5 div. down. |
| 9. Rotate sig. source 2 knob alternately to full +∅ and full −∅ and observe FDI | FDI pitch pointer & bar closely follow the movement of sig. source 2 knob. (DEADBEAT) |
| 10. Remove all jumpers | Both pointers & bars center. |
| B. STICK POSITION SENSOR | |
| 1. Jumper P200-K to P200-K' | |
| 2. Jumper sig. source 2 to P200-K | |
| 3. Adjust sig source 2 +∅ to indicate 1 volt on AC meter. | Pitch pointer & bar on FDI indicate 2 ± .5 div. up. |
| 4. Adjust sig. source 2 −∅ to indicate 1 volt on AC meter. | Pitch pointer & bar on FDI indicate 2 ± .5 div. down. |
| 5. Rotate sig. 2 knob alternately to full +∅ and full −∅ while observing FDI | Pitch pointer & bar lag behind movement of sig. source 2 knob. (LAG) |
| 6. Remove all jumpers | Both pointers & bars center. |
| C. C. G. TRIM | |
| 1. Jumper P217-C to P217-F | |
| 2. Jumper sig. source 2 to P217-C | |
| 3. Adjust sig. source 2 +∅ to indicate 2 volts on AC meter. | Pitch pointer & bar on FDI indicate 3 ± .5 div up. |
| 4. Adjust sig source −∅ to indicate 2 volts on AC meter. | Pitch pointer & bar on FDI indicate 3 ± .5 div down. |
| 5. Rotate sig source 2 knob alternately to full +∅ & full −∅ while observing FDI. | Pitch pointer & bar follow movement of sig source 2 knob. (SLIGHT LAG) |
| 6. Remove all jumpers. | Both pointers and bars center. |

-continued

| PROCEDURE | RESULTS |
|---|---|
| D. COUPLER IN | |
| 1. Jumper P217-B to P217-E | |
| 2. Jumper sig source 2 to P217-B | |
| 3. Adjust sig source 2 +∅ to indicate 6 VAC on meter. | Pitch pointer & bar on FDI indicate 3 ± .5 div. up. |
| 4. Adjust sig source 2 −∅ to cate 6 VAC on meter. | Pitch pointer & bar on FDI indicate 3 ± .5 div. down. |
| 5. Rotate sig source 2 knob alternately to full +∅ and full −∅ while observing FDI | Pitch pointer & bar on FDI follow the movement of sig source 2 knob. (SLIGHT LAG) |
| 6. Remove all jumpers. | Both pointers & bars on FDI center. |
| ROLL CHANNEL | |
| NOTE: ENSURE FDI IS IN "O" MODE AND AFCS 1 & 2 ARE ENGAGED | |
| A. ROLL RATE GYRO IN-FILTERED | |
| 1. Jumper P200-C to P200-E | |
| 2. Jumper sig source 2 to P200-C | |
| 3. Adjust sig source 2 +∅ to indicate 250 MV on AC meter | Roll point 304 and bar 303 on FDI indicate 2 ± .5 div right. |
| 4. Adjust sig source 2 −∅ to indicate 250 MV on AC meter. | Roll pointer & bar on FDI indicate 2 ± .5 div left. |
| 5. Rotate sig source 2 knob alternately to full +∅ and full −∅ while observing FDI. | FDI roll pointer & bar lag movements of sig source 2 knob. |
| 6. Disconnect all jumpers. | Both pointers & bars center. |
| B. ROLL RATE GYRO IN - UNFILTERED | |
| 1. Jumper P217-J to P217-K | |
| 2. Jumper sig source 2 to P217-K | |
| 3. Adjust sig source 2 +∅ to indicate 700 MV on AC meter | Roll pointer & bar on FDI indicate 3 ± .5 div right. |
| 4. Adjust sig source 2 −∅ to indicate 700 MV on AC meter | Roll pointer & bar on FDI indicate 3 ± .5 div left |
| 5. Rotate sig source 2 knob alternately to full +∅ and full −∅ while observing FDI | FDI roll pointer & bar follow the sig source 2 knob movement (SLIGHT LAG) |
| 6. Remove all jumpers | Both pointers & bars center. |
| C. COUPLER IN | |
| 1. Jumper P217-H to P217-L | |
| 2. Jumper sig source 2 to P217-L | |
| 3. Adjust sig source +∅ to indicate 7 VAC on meter | FDI roll pointer & bar indicate 3 ± .5 div right. |
| 4. Adjust sig source −∅ to indicate 7 VAC on meter | FDI roll pointer & bar indicate 3 ± .5 div left |
| 5. Rotate sig source knob alternately to full +∅ and −∅ while observing FDI | FDI roll pointer & bar follow sig source knob movement. (SLIGHT LAG) |
| 6. Remove all jumpers | Both pointers & bars center. |

| PROCEDURE | RESULTS |
|---|---|
| YAW CHANNEL | |
| A. SIMULATED HEADING INPUTS | |
| 1. Position Flight Director Indicator to "A" mode | |
| (NOTE: FDI REMAINS IN "A" MODE FOR DURATION OF YAW & ALT CHECKS) | |
| 2. Zero heading simulator. | |
| 3. Engage Yaw switch | |
| NOTE: YAW SWITCH REMAINS ON FOR DURATION OF YAW CHECKS | |
| 4. Increase heading on heading simulator 10 deg. | FDI yaw pointer 304 deflects 3 ± .5 div. left. |
| 5. Engage yaw sync switch | FDI yaw pointer syncs back to 0 ± .5 div |
| 6. Re-zero heading sim. | FDI yaw pointer remains at 0 ± .5 div |
| 7. Disengage yaw sync switch | |
| 8. Decrease heading on heading sim 10 deg. | FDI yaw pointer deflects 3 ± .5 right. |
| 9. Engage yaw sync switch | FDI yaw pointer syncs back to 0 ± .5 div |
| 10. Re-zero heading simulator | FDI yaw pointer remains at 0 ± .5 div |
| 11. Disengage yaw sync switch | |
| B. LATERAL ACCELEROMETER | |
| 1. Jumper sig source 2 to P217-X | |
| 2. Engage Coordinated turn switch | |
| 3. Adjust sig source +∅ to 100 MV on AC meter | After approx. 15 seconds, FDI yaw pointer drifts to 3 ± .5 div |

-continued

| PROCEDURE | RESULTS |
|---|---|
| | right (LAG) |
| 4. Disengage coordinated turn switch | After approx. 20 seconds FDI yaw pointer returns to center. (LAG) |
| 5. Engage coordinated turn switch | |
| 6. Adjust sig source −∅ to 100 MV on AC meter | After approx. 15 seconds FDI yaw pointer drifts to 3 ± .5 div left. (LAG) |
| 7. Disengage coordinated turn switch | After approx. 20 seconds FDI yaw pointer returns to center. (LAG) |
| 8. Remove all jumpers | Both pointers & bars center. |

C. ROLL RATE GYRO INPUT

| | |
|---|---|
| 1. Jumper sig. source 2 to P200-C | |
| 2. Adjust signal source +∅ indicate 2 VAC on meter. | |
| 3. Engage coordinated turn switch | FDI yaw pointer deflects 2 ± .5 div. left. |
| 4. Adjust sig source −∅ to indicate 2 VAC on meter | FDI yaw pointer deflects 2 ± .5 div right |
| 5. Rotate sig. source 2 knob alternately to full +∅ and full −∅ while observing FDI | FDI yaw pointer closely follows sig. source 2 knob movement (DEADBEAT) |
| 6. Disengage coordinated turn switch & remove jumper | Both pointers and bars center. |

D. YAW RATE GYRO INPUT

| | |
|---|---|
| 1. Jumper sig source 2 to P217-S | |
| 2. Position sig source scale knob to X.01 | |
| 3. Rapidly rotate sig source 2 knob to full +∅ while observing FDI | FDI yaw pointer deflects 2 ± .5 div right then drifts back to center |
| 4. Rapidly rotate sig source 2 knob to full −∅ while observing FDI. | FDI yaw pointer deflects 2 ± .5 div left then drifts back to center. |
| 5. Remove jumper | Both pointers & bars center |

ALTITUDE CHANNEL

A. BAR/ALT MODE

| | |
|---|---|
| 1. Engage Bar/Alt switch | |
| 2. Jumper sig source 2 to P217-P | |
| 3. Adjust sig source 2 +∅ to indicate 300 MV on AC meter | FDI collective pointer 305 indicates 2 ± .5 div up |
| 4. Adjust sig source 2 −∅ to indicate 300 MV on AC meter | FDI collective pointer indicates 2 ± .5 div down. |
| 5. Adjust sig source 2 +∅ to indicate 1 VAC on meter. | |
| 6. Connect positive lead of meter to P198-D | Integrator drives to exceed 15 VAC on meter & FDI coll. pointer indicates 4 ± .5 div up. |

(NOTE: READ STEPS 7 THROUGH 10 BEFORE PROCEEDING)

| | |
|---|---|
| 7. Connect positive lead of meter to sig source 2 output and adjust sig source −∅ to indicate 1 VAC on meter. | |
| 8. Quickly connect positive lead of meter to P198-D and time the integrator for one cycle from 10 VAC through null and back to 10 VAC. | Time for 1 cycle shall be 40 ± 10 seconds Meter continues to drive to exceed 15 VAC and FDI collective pointer indicates 4 ± .5 div. down. |

(NOTE: A SECOND METER MAY BE USED AT JACK P198-D INSTEAD OF SWITCHING METER LEADS BACK AND FORTH)

| | |
|---|---|
| 9. Connect positive lead of meter to sig. source 2 output and adjust sig source +∅ to indicate 1 VAC on meter. | |
| 10. Quickly connect positive lead of meter to P198-D and time integrator for 1 cycle from 10 VAC through null and back to 10 VAC | Time for one cycle shall be 40 ± 10 seconds |
| 11. Disengage Bar/Alt switch | Meter rapidly drops to less than 100 MV AC. |
| 12. Connect positive lead of meter to sig source 2 output and adjust sig source 2 +∅ to indicate 1 VAC on meter | |
| 13. Re-engage Bar/Alt switch | |
| 14. Connect positive lead of meter to P200-R' | Integrator drives to exceed 8 VAC on meter and FDI pointer indicates 4 ± .5 div up |

(NOTE: READ STEPS 15 THROUGH 18 BEFORE PERFORMING)

15. Connect positive lead of

-continued

| PROCEDURE | RESULTS |
|---|---|
| meter to signal source 2 output and adjust sig source $-\emptyset$ to indicate 1 VAC on meter | |
| 16. Quickly connect positive lead of meter to P200-R' and time integrator through one cycle from 5 VAC through null and back to 5 VAC. | Time for one cycle is 40 ± 10 seconds. Meter continues to drive to exceed 8 VAC. FDI coll. pointer indicates 4 ± .5 div down. |
| 17. Connect positive lead of meter to sig source 2 output & adjust sig source $+\emptyset$ to indicate 1 VAC on meter. | |
| 18. Quickly connect positive lead of meter to P200-R' and time integrator for one cycle from 5 VAC through null and back to 5 VAC. | Time for one cycle is 40 ± 10 seconds. |
| 19. Disengage Bar/Alt switch | Meter drops rapidly to less than 100 MV AC. |
| 20. Remove jumper between P217-P & sig source 2 output. | FDI pointers & bars center. |
| B-1. RAD/ALT ERROR | |
| 1. Engage Rad/Alt switch | |
| 2. Engage Rad/Alt Rel. switch | |
| 3. Jumper sig source 2 output to P200-T' | |
| 4. Connect meter to sig source 2 output | |
| 5. Adjust sig source 2 $+\emptyset$ to indicate 1 VAC on meter | FDI Coll. pointer indicates 1 ± .25 div up. |
| 6. Connect positive lead of meter to P198-K | Meter indicates 1 ± 100 MV AC. |
| 7. Connect positive lead of meter to sig source 2 output & adjust sig source $-\emptyset$ to indicate 1 VAC on meter. | FDI Coll. pointer indicates 1 ± .25 div down |
| 8. Connect positive lead of meter to P198-K | Meter indicates 1 ± 100 MV AC. |
| 9. Connect positive lead of meter to P198-D | Integrator drives to exceed 15 VAC. |
| 10. Disengage Rad/Alt Rel switch | FDI Coll pointer centers |
| 11. Disengage Rad/Alt switch | Voltage on meter decreases to less than 100 MV AC. |
| 12. Connect positive lead of meter to sig source 2 & adjust sig source $+\emptyset$ to indicate 2 VAC | |
| 13. Re-engage Rad/Alt & Rad/Alt Rel switches | FDI Coll pointer indicates 1.75 ± .25 div up |
| 14. Connect positive lead of meter to P198-K | Meter indicates 2 ± 200 MV AC |
| 15. Connect positive lead of meter to sig source 2 & adjust sig source $-\emptyset$ to indicate 2 VAC | FDI pointer indicates 1.75 ± .25 div down |
| 16. Connect positive lead of meter to P198-K. | Meter indicates 1.3 ± 150 MV AC |
| 17. Connect positive lead of meter to sig source and adjust $+\emptyset$ to indicate 5 VAC | FDI Coll. pointer indicates 3 ± .5 div up |
| 18. Connect positive lead of meter to P198-K. | Meter indicates 4 ± 400 MV AC |
| 19. Connect positive lead of meter to sig source 2 and adjust $-\emptyset$ to indicate 5 VAC | FDI Coll. pointer indicates 3 ± .5 div down |
| 20. Connect positive lead of meter to P198-K | Meter indicates 1.5 ± 250 MV AC |
| 21. Disengage Rad/Alt & Rad/Alt Rel switches | FDI Coll pointer centers & meter drops to less than 100 MV AC |
| 22. Remove jumper. | |
| B-2. RAD/ALT DOPPLER RATE SIGNAL | |
| 1. Connect positive lead of meter to sig source 2 output. | |
| 2. Engage Rad/Alt & Rad/Alt rel switches | |
| 3. Jumper P198-H to P200-D. | |
| 4. Jumper sig source 2 to P200-C' & Adjust $+\emptyset$ to indicate 250 MV AC on meter | FDI Coll pointer indicates 2 ± .5 div down. |
| 5. Connect positive lead of meter to P198-H. | Meter indicates 300 ± 25 MV AC |

-continued

| PROCEDURE | RESULTS |
|---|---|
| 6. Connect positive lead of meter to sig source 2 & Adjust $-\emptyset$ to indicate 250 MV AC on meter | FDI Coll pointer indicates 2 ± .5 div up |
| 7. Connect positive lead of meter to P198-H | Meter indicates 350 ± 25 MV AC |
| 8. Connect positive lead of meter to sig source 2 & adjust $+\emptyset$ to indicate 400 MV AC | FDI Coll pointer indicates 3 ± .5 div down |
| 9. Connect positive lead of meter to P198-H | Meter indicates 500 ± 50 MV AC |
| 10. Connect positive lead of meter to sig source 2 & adjust $-\emptyset$ to 400 MV AC on meter. | FDI Coll pointer indicates 3 ± .5 div up |
| 11. Connect positive lead of meter to P198-H | Meter indicates 540 ± 50 MV AC |
| 12. Disengage Rad/Alt and Rad/Alt Rel switches | Meter drops to below 100 MV AC & FDI Coll pointer centers |
| 13. Disconnect all jumpers. | Both pointers & bars center. |
| C. COUPLER MODE | |
| C-1. RADAR ALTIMETER ERROR | |
| 1. Engage Coupler, Rad/Alt, & Rad/Alt Rel switches | |
| 2. Jumper P198-G to P198-J | |
| 3. Jumper sig source 2 output to P200 T' | |
| 4. Connect positive meter lead to sig source 2 & adjust $+\emptyset$ to indicate 1 VAC on meter. | FDI Coll pointer indicates 1.5 ± .25 div up. |
| 5. Connect positive meter lead to P198-K | Meter indicates 1 ± 100 MV AC |
| 6. Connect positive meter lead to P198-D | Integrator drives to exceed 15 VAC |
| 7. Rotate sig source 2 knob rapidly & observe FDI yaw pointer | FDI yaw pointer moves with movement of sig source 2 knob then drifts back to center (YAW X-FEED) |
| 8. Connect positive meter lead to sig source 2 & adjust $-\emptyset$ to indicate 1 VAC on meter | FDI Coll pointer indicates 1.5 ± .5 div down |
| 9. Connect positive meter lead to P198-K | Meter indicates 1 ± 100 MV AC |
| 10. Connect positive meter lead to P198-D | Integrator drives to exceed 15 VAC |
| 11. Disengage Coupler switch | FDI Coll pointer centers & meter drops to less than 100 MV AC |
| 12. Remove all jumpers | Both pointers & bars center. |
| C-2 DOPPLER RATE | |
| 1. Engage Coupler, Yaw, Rad/Alt, & Rad/Alt Rel switches | |
| 2. Connect jumper from P198-G to P198-J. | |
| 3. Connect jumper from sig source 2 to P200-C' | |
| 4. Connect positive meter lead to sig source 2 output & adjust $+\emptyset$ to indicate 1 VAC on meter | FDI Coll pointer indicates 3 ± .5 div down |
| 5. Connect positive meter lead to P198-D | Integrator drives to exceed 15 VAC |
| 6. Connect positive meter lead to sig source 2 & adjust $-\emptyset$ to indicate 1 VAC on meter | FDI Coll pointer indicates 3 ± .5 div up |
| 7. Connect positive meter lead to P198-D | Integrator drives to exceed 15 VAC |
| 8. Rotate sig source 2 knob rapidly to full $+\emptyset$ and full $-\emptyset$ while observing FDI yaw pointer. | FDI yaw pointer moves with movement of sig source 2 knob then drifts back to center. (YAW X-FEED) |
| 9. Disconnect all jumpers and disengage all switches | Both pointers & bars center. |
| C-3 VERTICAL ACCELEROMETER IN | |
| 1. Engage Yaw, Coupler, Rad/Alt, & Rad/Alt Rel switches | |
| 2. Jumper P198-G to P198-J. | |
| 3. Jumper P198-D to ground. | |
| 4. Jumper sig source 2 to P217-E' | |
| 5. Connect positive meter lead to sig source 2 & adjust $+\emptyset$ to indicate 5 VAC on meter. | FDI Coll pointer indicates 2 ± .5 div down |
| 6. Connect positive meter lead to P198-E | Meter indicates 5.25 ± 500 MV AC |
| 7. Connect positive meter lead to | FDI Coll pointer indicates 2 ± .5 |

-continued

| PROCEDURE | RESULTS |
|---|---|
| sig source 2 & adjust $-\emptyset$ to indicate 5 VAC on meter. | div up |
| 8. Connect positive meter lead to P198-E | Meter indicates 5.25 ± 500 MV AC |
| 9. Rotate sig source 2 knob rapidly to full $+\emptyset$ and full $-\emptyset$ while observing FDI yaw pointer | FDI yaw pointer moves with movement of sig source 2 knob, then drifts back to center (YAW X-FEED) |
| 10. Remove all jumpers | Both pointers & bars center |
| C-4. NULL BOX IN | |
| 1. Ensure Yaw, Coupler, Rad/Alt, & Rad/Alt Rel switches are engaged | |
| 2. Jumper P198-G to P198-J | |
| 3. Jumper P198-D to ground | |
| 4. Jumper sig source 2 to P217-F' | |
| 5. Connect positive meter lead to sig source 2 & adjust $+\emptyset$ to indicate 5 VAC on meter | FDI Coll pointer indicates 2.5 ± .5 div down |
| 6. Connect positive meter lead to P198-E | Meter indicates 5.25 ± 500 MV AC |
| 7. Connect positive meter lead to P200-R' | Meter indicates 1.2 ± 200 MV AC |
| 8. Connect positive meter lead to sig source 2 & adjust $-\emptyset$ to indicate 5 VAC on meter | FDI Coll pointer indicates 2.5 ± .5 div up |
| 9. Connect positive meter lead to P198-E | Meter indicates 5.25 ± 500 MV AC |
| 10. Connect positive meter lead to P200-R | Meter indicates 1.2 ± 200 MV AC |
| 11. Rotate sig source 2 rapidly to full $+\emptyset$ and full $-\emptyset$ while observing FDI yaw pointer | FDI yaw pointer moves with movement of sig source 2 knob then drifts back to center (YAW X-FEED) |
| 12. Disconnect all jumpers, disengage all switches, disconnect meter, pull circuit breakers, disconnect AFCS Amp, disconnect power plugs | AFCS Amp is ready for installation in aircraft |

FAULT ISOLATION FOR AFCS AMPLIFIER TESTER PROCEDURE

ELEVATOR CHANNEL

A. PITCH V.G. IN
 1. R&R FDI
 2. Check fuses, check for tester power at test jacks on front of tester, check power through switches at jack 217-T' (AFCS-1) and jack 217-Z (AFCS-2), check pins A (AFCS-1) and B (AFCS-2) of P-34 of Tester wiring harness.
 3. Swap cards—if problem changes with card, check card on module tester. If unable to null, change cards.
 7. If meter has correct voltage reading and either pointer or bar moves, swap cards. If problem changes with card, change card.
 8. Same as 7.
 9. Same as 7.

B. STICK POSITION SENSOR
 3. Same as A-7.
 4. Same as 3.
 5. Same as 3.

C. C.G. TRIM
 3. Same as A-7.
 4. Same as 3.
 5. Same as 3.

D. COUPLER IN
 3. Same as A-7.
 4. Same as 3.
 5. Same as 3.

ROLL CHANNEL

A. ROLL RATE GYRO IN—FILTERED
 3. Same as 1-A-7.
 4. Same as 3.
 5. Same as 3.

B. ROLL RATE GYRO IN—UNFILTERED
 3. Same as 1-A-7.
 4. Same as 3.
 5. Same as 3.

C. COUPLER IN
 3. Same as 1-A-7.
 4. Same as 3.
 5. Same as 3.

YAW CHANNEL

A. SIMULATED HEADING INPUTS
 1. R&R FDI
 4. Check for voltage change at J200-EE,FF, and U'. If voltage change is present, check for voltage change at J200-N' and M'. If voltage change is present, check fuses, FDI, or tester wiring. If voltage change is not present, swap out Yaw module (AR7). If no change occurs, check yaw sync module (AR8) on module tester. If AR8 tests good check yaw sync motor generator.
 5. Check fuses, swap out YAW MODULE (AR7). If pointer still does not sync, test Yaw Sync module (AR8) on module tester, then Yaw Sync Motor Generator.
 6. Check Yaw Sync module (AR8) or Yaw Sync Motor Generator.
 8. See 4.
 9. See 5.
 10. See 6.

B. LATERAL ACCELEROMETER
3. Check fuses, swap out Yaw module (AR7), check Yaw Sync module (AR8), check Yaw Sync Motor Generator.
4. Check Yaw Sync Module (AR8), check Yaw Sync Motor Generator.
5. See 3.
6. See 4.

C. ROLL RATE GYRO INPUTS
3. See 3-B-3.
4. See 3.
5. See 3.

D. YAW RATE GYRO INPUTS
3. See 3-B-3.
4. See 3.

ALTITUDE CHANNEL

A. BAR/ALT
3. Check for voltage change at J200-A' and W', check fuses, check altitude module (AR5).
4. See 3.
6. Check fuses, check Alt Module (AR5), check alt Integrator module (AR6).
8. See 6 (probably alt integrator).
10. See 8.
11. Check Alt Integrator (AR6) (relay K-2).
14. See 6.
16. See 8.
18. See 8.
19. See 11.

B. RAD/ALT MODE
B-1. RAD/ALT ERROR
5. Check fuses, check for 28VDC at J217-W with RAD/ALT engaged, check for 28 VDC at J200-D' with RAD/ALT REL engaged. Check alt. Integ. module.
6. Check fuses check for 28 VDC at J217-W with RAD/ALT engaged, check for 28VDC at J200-D' with RAD/ALT REL engaged. Check alt. Integ. module.
7. See 5.
8. See 6.
9. See 6.
10. See 5.
11. See 6.
13. See 5.
14. See 6.
15. See 5.
16. See 6.
17. See 5.
18. See 6.
19. See 5.
20. See 6.

B-2. RAD/ALT DOPPLER RATE SIGNAL
4. Check fuses, check Altitude Module (AR5), check Alt. Integrator Module (AR6).
5. Check fuses, check alt Integrator module (AR6)
6. See 4.
7. See 5.
8. See 4.
9. See 5.
10. See 4.
11. See 5.

C. COUPLER MODE
C-1 RAD/ALT ERROR
4. See 4-B-1-5.
5. See 4-B-1-6.
6. See 5.
7. See 4, also check Yaw module (AR7).
8. See 4.
9. See 5.
10. See 5.

C-2 DOPPLER RATE (Vz)
4. See 4-B-2-4.
5. See 4-B-2-5.
6. See 4.
7. See 5.
8. See 4, also check yaw module (AR7).

C-3 VERTICAL ACCELEROMETER IN
5. Check fuses, check Alt Module (AR5), check Alt. Integrator Module (AR6)
6. Check fuses, check Alt. Integrator Module (AR6).
7. See 5.
8. See 6.
9. See 5.

C-4. NULL BOX IN
4. See 4-C-3-5.
5. See 4-C-3-6.
6. See 5.
7. See 5.
8. See 4.
9. See 5.
10. See 4 and check Yaw module (AR7).

Thus, while preferred constructional features of the invention are embodied in the structure illustrated herein, it is to be understood that changes and variations may be made by the skilled in the art without departing from the spirit and scope of my invention.

I claim:

1. A tester for an amplifier unit of an automatic flight control system of an aircraft, wherein the system includes input means comprising sensors and controls which directly or indirectly supply input signals to the amplifier unit, and output means comprising servomechanisms, with a flight director indicator having a plurality of indicators connected to indicate the output signals applied to the servomechanisms:

wherein said amplifier unit comprises several modules which plug into module receptacles on a common chassis, and system receptacle means for receiving plug means connecting the amplifier unit into the system input means and output means, with chassis wiring interconnecting the module receptacles and system receptacle means, wherein the amplifier unit provides a plurality of functions with different modules, the output means having separate servomechanisms for the different functions, with at least some functions having more than one module;

wherein said tester comprises:

a plurality of test jacks, wiring extending between the test jacks and a plurality of plugs comprising amplifier plug means for connection to said system receptacle means of an amplifier unit to be tested, and also indicator plug means for connection to a flight director indicator, each plug having a plurality of pins, the test jack being connected to individual pins of the amplifier plug means;

a plurality of impedance devices connected between a ground line and pins of the indicator plug means, the impedance devices also being connected to some of the test jacks and via said wiring to corresponding pins of the amplifier plug means to be connected in place of and simulate said servomechanisms;

a plurality of switches connected between a source of direct-current power and some of the test jacks for selectively providing power to the amplifier unit and to the flight director indicator to test different ones of said functions, and to simulate system input signals;

two identical signal sources with output test jacks, which permits jumper connections from the signal sources to test jacks of selected pins of the amplifier plug means to simulate system input signals, and permitting different signals to be jumpered to test jacks for separate inputs of the amplifier unit;

wherein each of said signal sources is an alternating current source comprising a transformer with a secondary winding having a grounded center tap, a potentiometer connected across the secondary winding with a moveable tap which when centered is at ground potential, movement of the tap in one direction provides output signals of one phase, and movement of the tap in the other direction provides output signals of the opposite phase, said signal sources each including a two-pole switch connected between its said secondary winding and its said potentiometer, with series resistors, to provide different output voltage ranges;

being so constructed and arranged that the amplifier unit may be tested as a unit the way it is used in the system, with indications on the flight director indicator, but independently of said system input means and output means, the amplifier unit along being removed from the aircraft for testing;

wherein said amplifier unit includes duplicate modules to provide dual channels for at least one function, with at least some of the input signals being also duplicated from said two sources and requiring duplicate output signals for the dual channels to indicate that both channels are operating normally;

wherein the tester is capable of providing the same input via jumpers from test jacks of the signal sources to test jacks for corresponding inputs of the duplicate modules for the dual channels so that the duplicate modules may be balanced, as indicated by the indicator means:

wherein at least one of the functions uses first and second modules, with the first module providing preprocessing for the second module, such that testing for the function is facilitated by having the modules tested together as a unit when simulated input signals are supplied to the first module and resulting output signals from the second module are monitored on the flight director indicator.

2. A tester according to claim 1, wherein said functions are pitch, roll, altitude, and yaw;

wherein the pitch and roll functions are each provided with duplicate modules for dual channels, and wherein the yaw function is provided by two modules, one of which is a yaw synchronizer module providing preprocessing for the other module, and the amplifier unit also includes a control transformer mechanically coupled to a motor-tachometer generator, the control transformer being connected to pins of the system receptacle means for heading indication, which are normally connected in the system to a compass system of the input means, the motor-tachometer being connected to the yaw synchronizer module;

and wherein the tester further includes a heading simulator connected to pins of the amplifier plug means which mate with said pins of said system receptacle means for heading indication.

* * * * *

UNITED STATES PATENT AND TRADEMARK OFFICE
CERTIFICATE OF CORRECTION

PATENT NO. : 4,608,531

DATED : August 26, 1986

INVENTOR(S) : Michael L. Stephens

It is certified that error appears in the above-identified patent and that said Letters Patent is hereby corrected as shown below:

At column 20, line 16, "rounted" should read --routed--.

At column 22, line 66, a period (.) should follow "interchangeable".

At column 9, line 26, "foll" should read --roll--.

At column 21, line 11, "byro" should read --gyro--.

At column 21, line 32, "dircuitry" should read --circuitry--.

At column 29, C. COUPLER IN, Item 5, --full-- should precede "-∅".

At column 41, line 31, "along" should read --alone--.

Signed and Sealed this
Twenty-seventh Day of January, 1987

Attest:

DONALD J. QUIGG

*Attesting Officer*   *Commissioner of Patents and Trademarks*